US006493787B1

(12) United States Patent
Yamamoto et al.

(10) Patent No.: US 6,493,787 B1
(45) Date of Patent: Dec. 10, 2002

(54) DEVICE, SYSTEM AND METHOD FOR ACCESSING PLATE-SHAPED MEMORY

(75) Inventors: Tokio Yamamoto; Hidetoshi Torii, both of Chiba; Ichiro Mayama; Mari Sugiura, both of Tokyo, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/523,280

(22) Filed: Mar. 10, 2000

(30) Foreign Application Priority Data

Mar. 12, 1999 (JP) .......................................... 11-066840

(51) Int. Cl.[7] .............................................. G06F 12/00
(52) U.S. Cl. ...................... 711/100; 711/103; 711/114; 711/147; 711/150; 711/151; 711/153; 711/163; 711/167; 710/244
(58) Field of Search ................................. 711/103, 105, 711/161, 100, 114, 147, 151, 153, 154, 163, 167, 168, 169; 710/35, 52, 244

(56) References Cited

U.S. PATENT DOCUMENTS 6,016,472 A * 1/2000 Ali .............................. 704/500

6,092,082 A * 7/2000 Maruyama ................... 707/200

FOREIGN PATENT DOCUMENTS

JP 6333097 12/1994

* cited by examiner

Primary Examiner—Do Hyun Yoo
Assistant Examiner—Jasmine Song
(74) Attorney, Agent, or Firm—Jay H. Maioli

(57) ABSTRACT

A drive apparatus wherein a plurality of media each including a memory element can be successively accessed to continuously write and/or read out data into and/or from the media includes a loading device for loading a plurality of storage media such that data are individually written into and/or read out from the storage media, an accessing circuit for accessing the storage media loaded in the loading circuit to write and/or read out the data into and from the storage media, and a controller for controlling, when the plurality of storage media are loaded in the loading circuit, the accessing circuit to continuously perform writing into and/or reading out from the plurality of storage media loaded in the loading circuit.

69 Claims, 11 Drawing Sheets

DEVICE, SYSTEM AND METHOD FOR ACCESSING PLATE-SHAPED MEMORY

BACKGROUND OF THE INVENTION

This invention relates to a drive apparatus into which a plurality of storage media in which various data files of, for example, music data and so forth can be stored can be loaded.

In recent years, a storage medium of a small size in which a semiconductor recording element such as, for example, a flash memory is loaded has been developed. The storage medium of the type mentioned is built in a drive apparatus for exclusive use or a drive apparatus for the storage medium is built in an audio/video apparatus or an information apparatus so that computer data, still picture data, moving picture data, music data and/or audio data can be recorded into the storage medium.

Meanwhile, such media as a CD (compact disc) and an MD (mini disc: trademark) have conventionally spread widely as media for recording music data thereon, and they can be recorded and played back by a CD player and an MD recorder/player, respectively.

On the other hand, a so-called changer player is conventionally known which accommodates a plurality of media such as, CDs or MDs and can selectively play back the media.

For the changer player, a user can select a desired CD from among a plurality of CDs and cause it to be played back or can cause a different CD to be played back after reproduction of a certain CD without manually exchanging of an accommodated CD or the like.

However, the changer player described above has the following problems. In particular, the changer player includes, as components thereof, a storage section for storing a plurality of media such as CDs, a mechanism deck section at a reproduction position at which an optical head, a spindle motor and so forth are disposed, and a transport mechanism for taking out one medium from within the storage section, transporting it to the reproduction position and transporting, after playback of the medium comes to an end, the medium back to the storage position thereof. Further, the changer player requires a space for allowing such movement of a medium by the transport mechanism. Consequently, it cannot be avoided that the changer player be complicated in construction and be large in size.

Further, since while a medium is being exchanged by the transport mechanism, naturally reproduction sound is interrupted, even if a plurality of media are successively exchanged to continuously play them back, reproduction sound is interrupted for a time required for each exchanging procedure (for example, approximately 5 to 10 seconds). Where music data are reproduced successively, it is felt by the user that the silence period of approximately 5 to 10 seconds is considerably long, and this sometimes degrades the feeling of the user in enjoying the reproduction.

It is to be noted that the changer player can be constructed such that, in order to prevent such silence for a medium exchanging period, reproduction data are stored into a buffer memory and, upon exchanging, the reproduction data from the buffer memory are outputted. However, naturally this requires a memory device of a comparatively large capacity and requires complicated control in reading out operation and buffering operation.

Further, as a medium is mechanically moved by the transport mechanism, it is necessary to realize assurance of durability and minimization of operation sound, And it is necessary to make various technical contrivances. Also this makes an obstacle to simplification of the apparatus construction.

SUMMARY OF THE INVENTION

It is an object of the present invention to provide a drive apparatus wherein a plurality of media each including a memory element can be successively accessed to continuously write and/or read out data into and/or from the media.

In order to attain the object described above, according to an aspect of the present invention, there is provided a drive apparatus for writing and/or reading out data into and from a recording medium which includes a memory element, comprising loading means for loading a plurality of storage media such that data are individually written into and/or read out from the storage media, accessing means for accessing the storage media loaded in the loading means to write and/or read out the data into and from the storage media, and control means for controlling, when the plurality of storage media are loaded in the loading means, the accessing means to continuously perform writing into and/or reading out from the plurality of storage media loaded in the loading means.

Preferably, the drive apparatus further comprises selection means for allowing the accessing means to selectively access one of the plurality of storage media loaded in the loading means.

With the drive apparatus, only by controlling the selection condition of the selection means and the accessing operation of the accessing means with regard to the plurality of recording media loaded in the loading means, it is possible to perform successive accessing to the plurality of storage media without any interruption in time or to immediately access any of the plurality of recording media when it is designated. Consequently, when it is tried to continuously reproduce data such as, for example, music data or in a like case, little time is required for changing over of the recording medium of an object of accessing, and consequently, for example, such a situation that the user is obliged to wait while no sound is outputted as reproduction sound is eliminated. Also another situation wherein the user must wait for a certain period of time after the user designates a tune to be reproduced is eliminated. In other words, the drive apparatus is advantageous in that it can provide a reproduction output satisfactory to the user. Further, the drive apparatus is useful to its user naturally in that data transfer to or between or data recording into a plurality of recording media can be executed efficiently without any time loss.

Further, since it is not necessary to physically move a storage medium in order to exchange a storage medium to be accessed or a place for accommodating those storage media which are not currently an object of accessing is not required, for example, such an accommodation section and a transport section as well as a space for allowing transportation of a storage medium as in a conventional changer player are not required. Also a buffer memory for preventing a reproduction output from being interrupted in time is not necessary. From those, miniaturization of the apparatus and simplification in processing of the apparatus construction can be promoted, and consequently, reduction in cost can be achieved.

Preferably, the drive apparatus further comprises loading detection means for detecting whether or not a storage medium is loaded in each of a plurality of storage medium loading portions of the loading means, the selection means invalidating accessing by the accessing means to any of the storage medium loading portions in which it is detected by the loading detection means that no storage medium is loaded. With the drive apparatus, occurrence of an invalid selection condition is prevented by the selection means, and consequently, an efficient operation can be achieved.

According to another aspect of the present invention, there is provided a drive system for writing and/or reading out data into and from a recording medium which includes a memory element, comprising a plurality of storage media, loading means for loading the plurality of storage media such that data are individually written into and/or read out from the storage media, accessing means for accessing the storage media loaded in the loading means to write and/or read out the data into and from the storage media, and control means for controlling, when the plurality of storage media are loaded in the loading means, the accessing means to continuously perform writing into and/or reading out from the plurality of storage media loaded in the loading means.

Preferably, the drive system further comprises selection means for allowing the accessing means to selectively access one of the plurality of storage media loaded in the loading means.

Preferably, the drive system further comprises loading detection means for detecting whether or not a storage medium is loaded in each of a plurality of storage medium loading portions of the loading means, the selection means invalidating accessing by the accessing means to any of the storage medium loading portions in which it is detected by the loading detection means that no storage medium is loaded.

Also with the drive system, similar advantages to those of the drive apparatus described above can be achieved.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENT

In the following, a preferred embodiment of the present invention will be described. In the embodiment, the present invention is applied to a drive apparatus which can write and read out data into and from a plate-shaped memory having a plate-like outer profile as a storage medium.

The description proceeds in the following order.

1. Plate-Shaped Memory
2. Interface between Plate-Shaped Memory and Drive Apparatus
3. Construction of Drive Apparatus
4. Continuous Reproduction Mode Operation
5. Track Designation Reproduction Mode Operation and Other Reproduction Modes
6. Transfer Mode Operation
7. Continuous Recording Mode Operation 1. Plate-Shaped Memory First, a plate-shaped memory which is a recording medium used in the drive apparatus of the present embodiment is described with reference to FIGS. 1 to 3.

Figure 1:
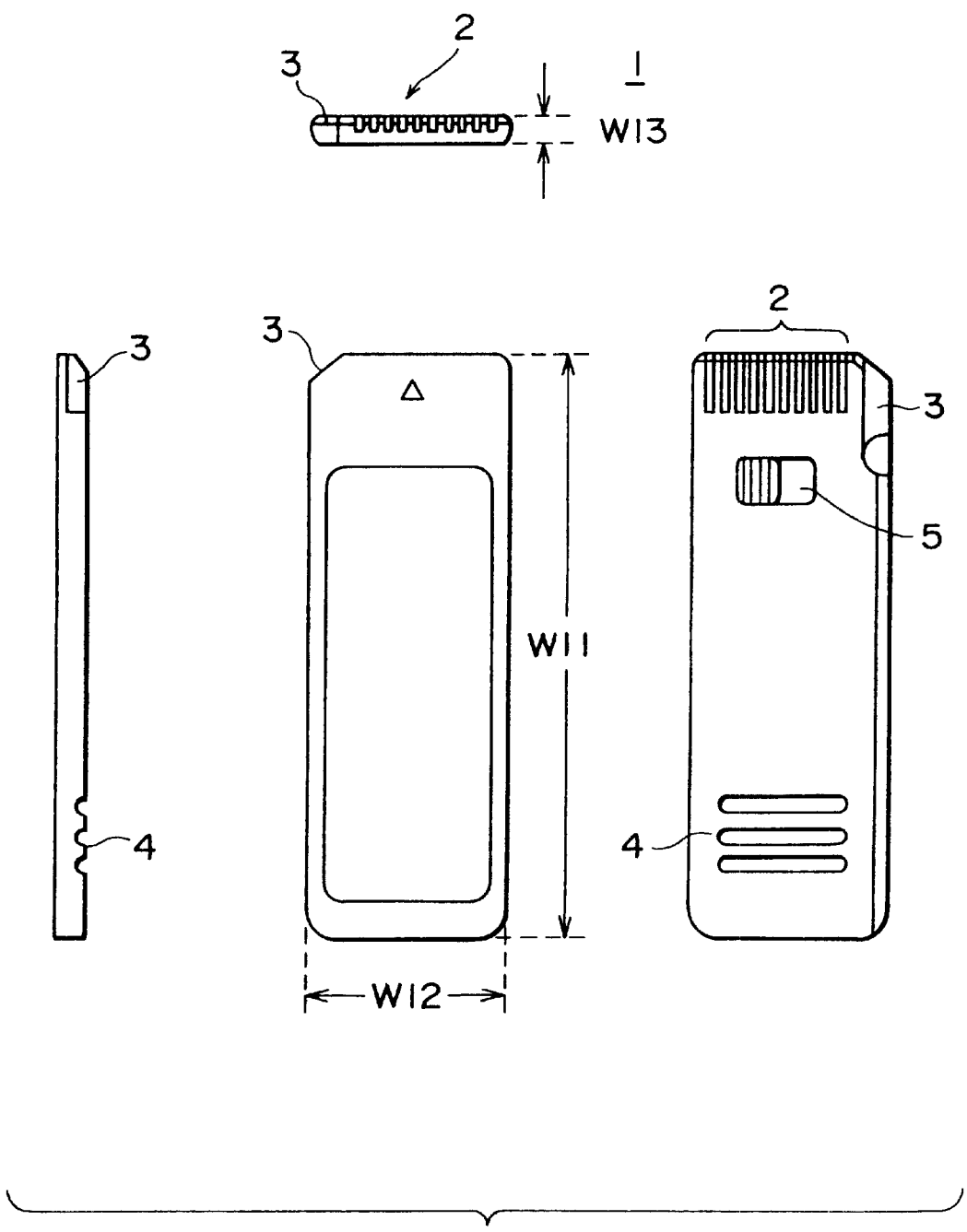
FIG. 1 includes a top plan view, a front elevational view, a side elevational view and a bottom plan view showing an outer profile of a plate-shaped memory used in a drive apparatus to which the present invention is applied.

The plate-shaped memory is generally denoted at 1 and includes, for example, a semiconductor memory device of a predetermined capacity inside of a plate-shaped housing as shown in FIG. 1. For the semiconductor memory device, a flash memory is used.

The housing shown in a top plan view, a front elevational view, a side elevational view and a bottom plan view in FIG. 1 is formed, for example, by plastic molding. As an example of the size of the housing, the dimensions W11, W12 and W13 shown in FIG. 1 are W11=60 mm, W12=20 mm and W13=2.8 mm, respectively.

A terminal section 2 including, for example, 10 electrodes extends from a lower portion of a front wall of the housing toward the bottom side, and reading out or writing operation from or into the memory device in the plate-shaped memory 1 is performed through the terminal section 2.

The housing has a cutaway portion 3 at a left upper corner portion thereof as viewed in top plan view. The cutaway portion 3 is provided, for example, in order to prevent the plate-shaped memory 1 from being inserted in a wrong direction when the plate-shaped memory 1 is inserted into a loading mechanism in a body of the drive apparatus.

Further, an anti-slip corrugated portion 4 is formed on the bottom wall of the housing in order to assure augmented convenience in use.

Furthermore, a slide switch 5 for preventing erasure of recorded contents in error is formed on the bottom wall of the housing.

It is prescribed that the plate-shaped memory 1 has a flash memory capacity which is one of 4 MB (megabytes), 8 MB, 16 MB, 32 MB, 64 MB and 128 MB.

Further, a FAT (File Allocation Table) system is used as a file system for data recording/reproduction.

The writing speed is 1,500 KBytes/sec to 330 KBytes/sec; the reading out speed is 2.45 MByte/sec; the writing unit is 512 bytes; and the erasing block size is 8 KB or 16 KB.

Further, the power supply voltage Vcc is 2,7 to 3.6 V, and the serial clock SCLK of the maximum is 20 MHz.

Figure 2:
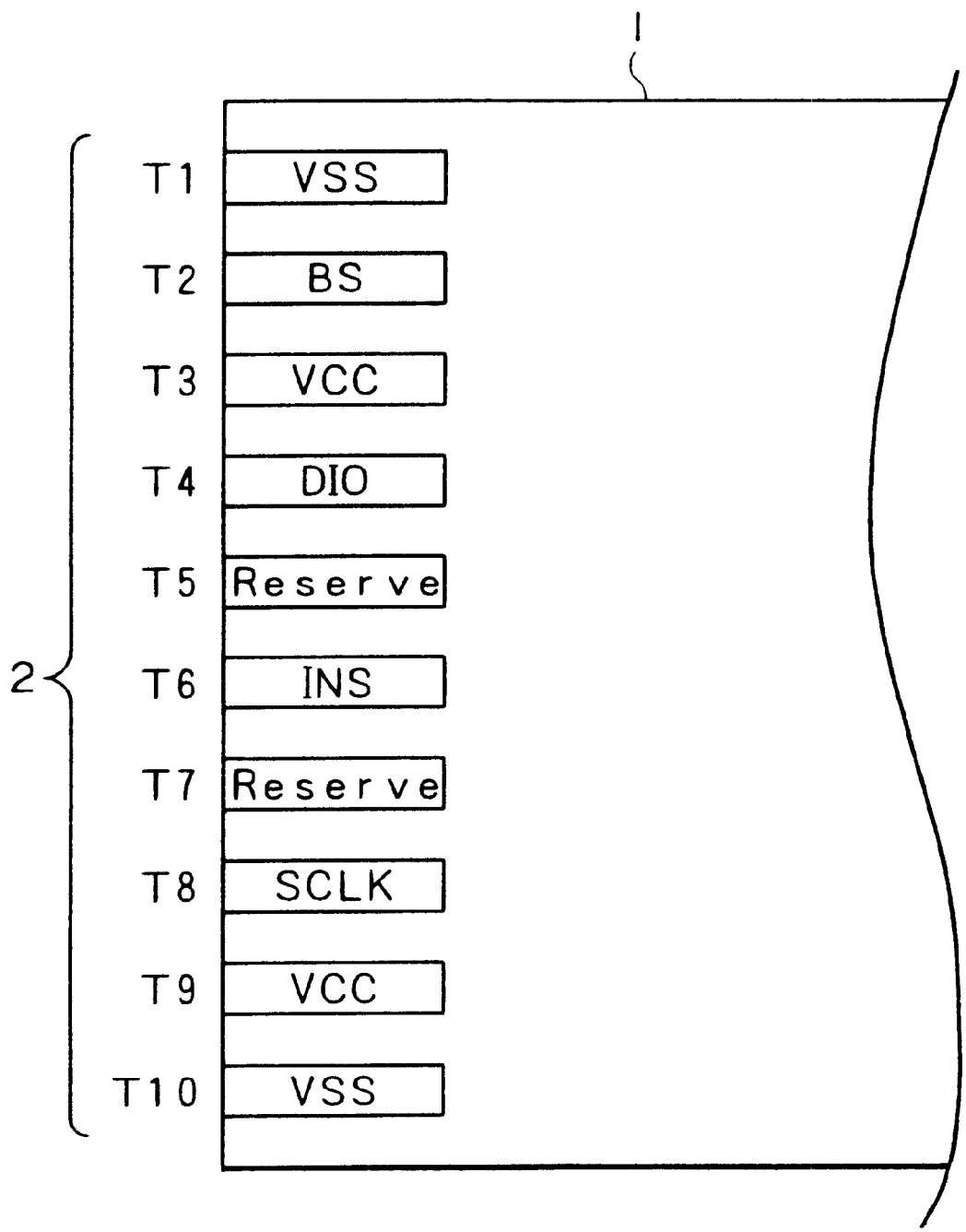
FIG. 2 is a schematic view showing a terminal structure of the plate-shaped memory of FIG. 1.

FIG. 2 shows an electrode structure of the terminal section 2. As can be seen from FIG. 1, the terminal section 2 has a structure wherein 10 plane electrodes are arranged in a row. The electrodes (terminals T1 to T10) are such as follows.

The terminals T1 to T10 are used as terminals for a detection voltage Vss.

The terminal 2 is used as an input terminal of a serial protocol bus state signal BS.

The terminals T3 and T9 used as terminals for a power supply voltage Vcc.

The terminal T4 is used as a data terminal, that is, an input/output terminal of a serial protocol data signal.

The terminals T5 and T7 are reserved.

The terminal T6 is a detection terminal and is used to detect loading of the plate-shaped memory into the drive apparatus by the drive apparatus.

The terminal T8 is used as an input terminal of the serial clock signal SCLK.

Figure 3:
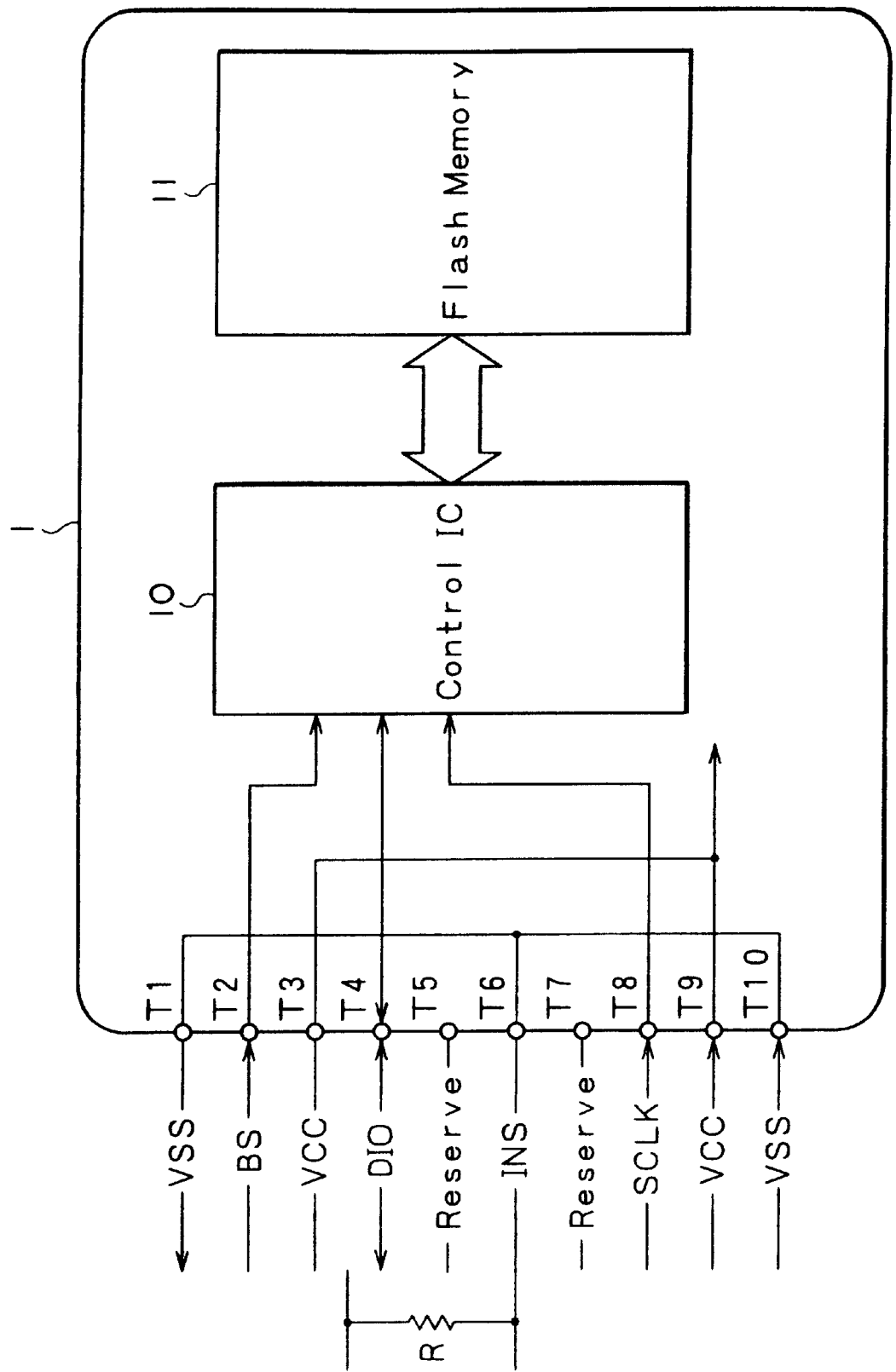
FIG. 3 is a schematic view showing an internal structure of the plate-shaped memory of FIG. 1.

FIG. 3 shows the terminals and an internal construction of the plate-shaped memory 1.

Referring particularly to FIG. 3, the plate-shaped He memory 1 has a control IC 10 and a flash memory 11 provided therein. The control IC 10 executes writing into and reading out from the flash memory 11.

As can be seen from FIG. 3, the serial protocol bus state signal BS from the terminal T2 and the serial clock signal SCLK from the terminal T8 are supplied to the control IC 10. Upon writing operation, the control IC 10 performs writing of data supplied from the terminal T4 into the flash memory 11 in accordance with tie serial protocol bus state signal BS and the serial clock signal SCLK. Further, upon reading out, the control IC 10 reads out data from the flash memory 11 and outputs the data from the terminal T4 to the drive apparatus side in accordance with the serial protocol bus state signal BS and the serial clock signal SCLK.

Further, the detection voltage Vss is supplied to the detection terminal T6 so that, by detecting a terminal voltage of the detection terminal T6 by means of a resistor R as seen in FIG. 3, it can be detected by the drive apparatus side whether or not the plate-shaped memory 1 is connected to a loading section (connector which is hereinafter described).

2. Interface Between Plate-Shaped Memory and Drive Apparatus

Figure 4:
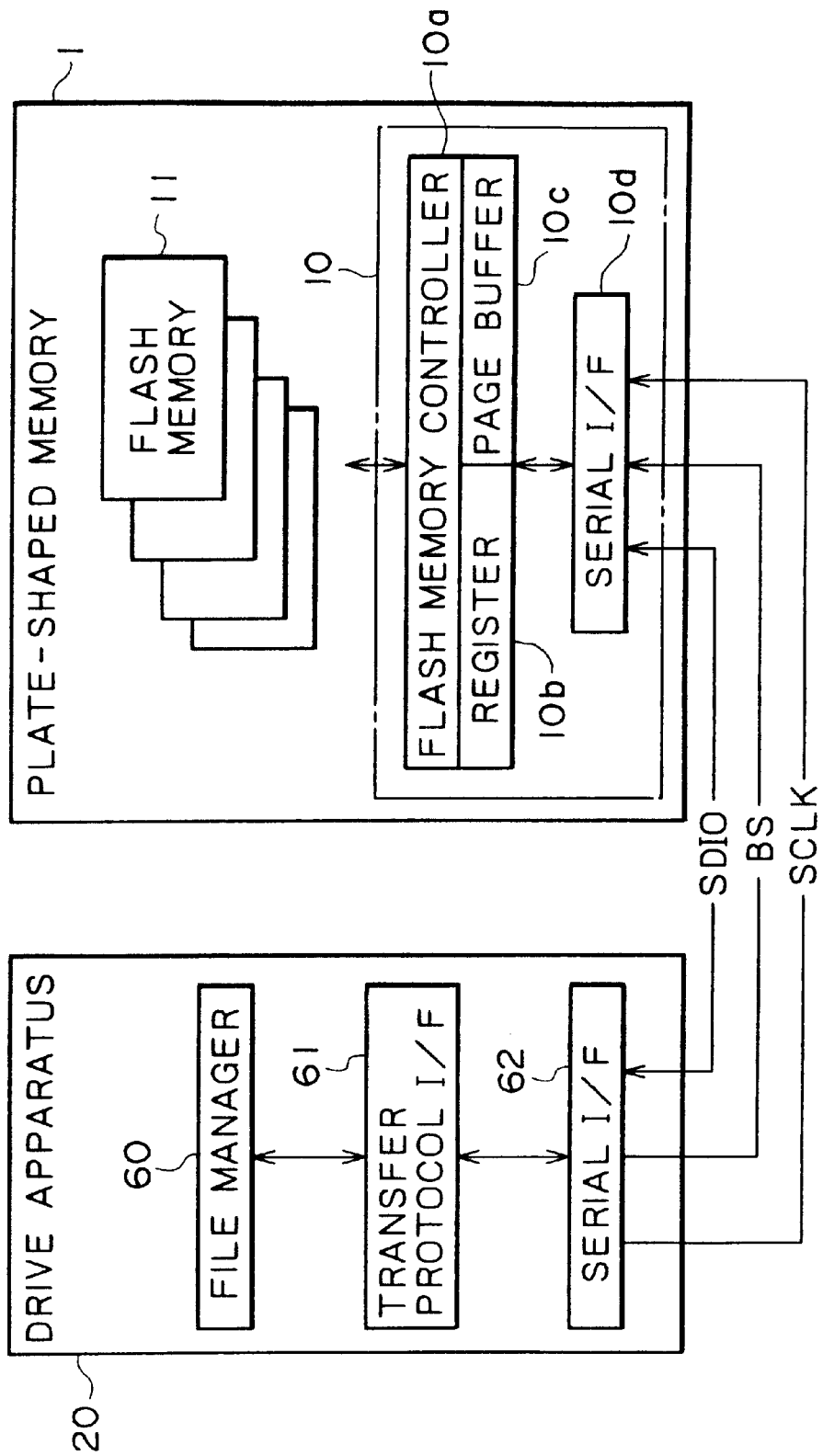
FIG. 4 is a block diagram showing an interface structure of the plate-shaped memory of FIG. 1 and the drive apparatus to which the present invention is applied.

A construction of a serial interface system between the plate-shaped memory 1 and a drive apparatus 20, which will be described later, is explained with reference to FIG. 4.

The control IC 10 in the plate-shaped memory 1 includes blocks of a flash memory controller b1a, a register 10b, a page buffer 10c, and a serial interface 10d.

The flash memory controller 10a performs data transfer between the flash memory 11 and the page buffer 10c based on a parameter set in the register 10b.

Data buffered in the page buffer 10c is transferred to the drive apparatus 20 through the serial interface 10d, and data transferred from the drive apparatus 20 is buffered into the page buffer 10c through the serial interface 10d.

The drive apparatus 20 includes a file manager 60, a transfer protocol interface 61 and a serial interface 62 as an interface structure for the plate-shaped memory 1.

The file manager 60 performs file management of the plate-shaped memory 1. For example, in the system of the present example, a management file for management of main data files is stored in the plate-shaped memory 1. The drive apparatus 20 reads in the management file from the plate-shaped memory 1 loaded therein and a CPU (Central Processing Unit) 41 which is hereinafter described forms the file manager 60. Accessing to the plate-shaped memory 1 is executed in accordance with the file manager 60.

The transfer protocol interface 61 executes accessing to the register 10b and the page buffer 10c.

The serial interface 62 prescribes a protocol for performing arbitrary data transfer over three signal lines between the serial interface 62 and the plateshaped memory 1, that is, signal lines SCLK (serial clock signal), BS (bus state) and SDIO (serial data input/output).

By operation of the components described above, reading out accessing/writing accessing to the plate-shaped memory 1 (flash memory 11) by the drive apparatus 20 are executed.

3. Construction of Drive Apparatus

A construction of the drive apparatus 20 of the present embodiment which can perform recording and reproduction operations into and from the plate-shaped memory 1 is described with reference to FIGS. 5, 6 and 7.

It is to be noted that the drive apparatus 20 handles various kinds of main data as an object of writing and reading out into and from the plate-shaped memory 1. The main data may be, for example, moving picture data, still picture data, audio data (voice data), HiFi audio data (music data) and control data.

Figure 5:
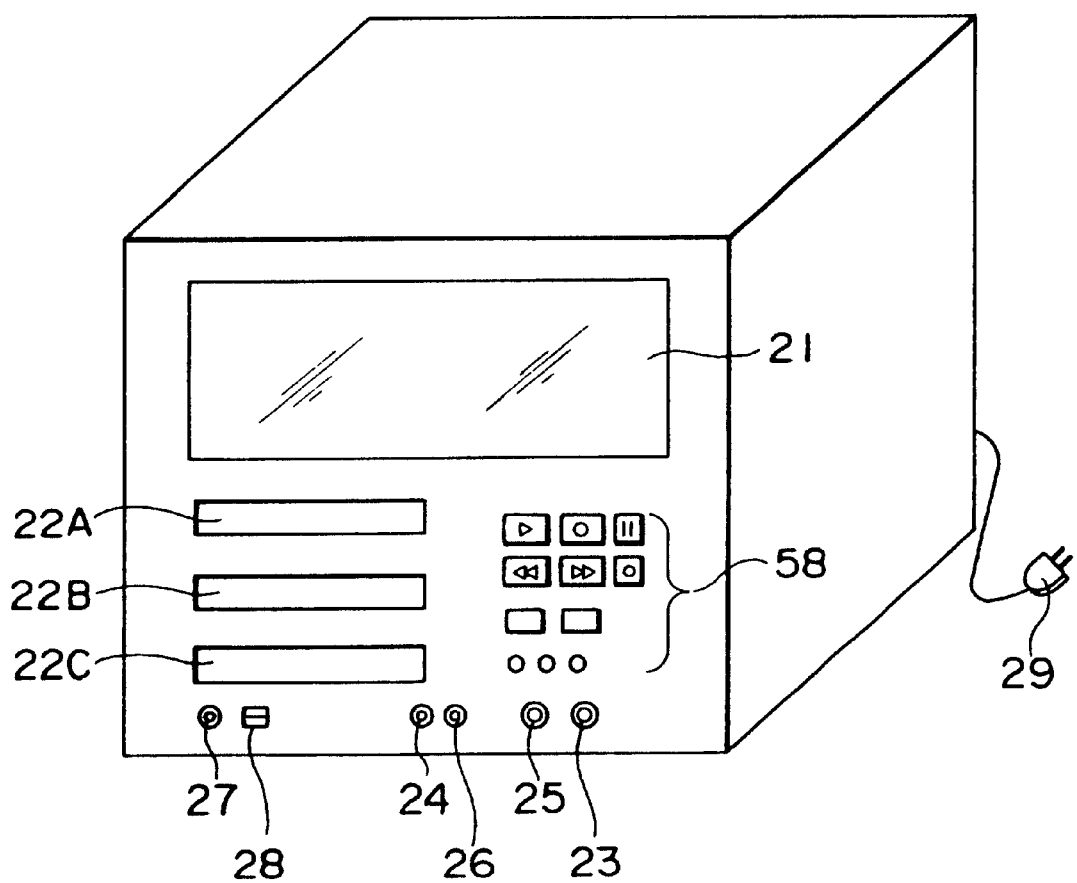
FIG. 5 is a perspective view showing an example of an appearance of the drive apparatus to which the present invention is applied.

FIG. 5 shows an example of an appearance of the drive apparatus 20.

Referring to FIG. 5, the drive apparatus 20 has a display section 21 formed on a front wall thereof. The display section 21 may be, for example, a liquid crystal panel and displays thereon a reproduced image or characters, information incidental to sound or music reproduced, an operation guide message and so forth.

Further, inlet openings 22A, 22B and 22C each for receiving the plate-shaped memory 1 are formed in the front wall of the drive apparatus 20 so that maximum three plate-shaped memories 1 may be loaded into the drive apparatus 20.

Into and from the plate-shaped memories 1 inserted in the drive apparatus 20 through the inlet openings 22A, 22B and 22C and connected to a connector section 30 in the inside of the drive apparatus 20 which is hereinafter described, recording and reproduction of various data (music data, audio data, moving picture data, still picture data, computer data, control data and so forth) are performed by the drive apparatus 20.

It is to be noted that, while it is described that maximum three plate-shaped memories 1 can be loaded into the drive apparatus 20 of the present embodiment, the drive apparatus according to the present invention may be constructed so that at least two plate-shaped memory 1 can be loaded therein simultaneously. Accordingly, the drive apparatus according to the present invention may naturally be constructed so that four or more plate-shaped memory 1 can be loaded therein simultaneously.

Further, in order to allow connection to various apparatus, various terminals are formed on the drive apparatus 20. For example, a headphone terminal 23 and a microphone input terminal 25 are formed on the drive apparatus 20.

If a headphone is connected to the headphone terminal 23, then a reproduction sound signal is supplied to the headphone so that the user can listen to the reproduction sound.

If a microphone is connected to the microphone input terminal 25, then the drive apparatus 20 can fetch a sound signal collected by the microphone and record the sound signal, for example, into a plate-shaped memory 1.

Further, a line output terminal 24, a line input terminal 26 and a digital input terminal 27 are formed on the drive apparatus 20.

If an external apparatus is connected to the line output terminal 24 by an audio cable, then a reproduction sound signal can be supplied from the drive apparatus 20 to the external apparatus. For example, it is possible to connect an audio amplifier to the line outer terminal 24. so that the user can listen to music/sound reproduced from the plate-shaped memory 1 by a speaker system or to connect a mini disc recorder or a tape recorder to the line output terminal 24 to record music/sound reproduced from the plate-shaped memory 1 onto another medium as dubbing.

Further, if an external apparatus is connected to the line input terminal 26, then it is possible, for example, to fetch a sound signal supplied from the external apparatus such as a CD player and record the sound signal, for example, into a plate-shaped memory 1.

Furthermore, it is possible to receive digital audio data transmitted over an optical cable through the digital input terminal 27. For example, if an external CD player or a like apparatus is an apparatus ready for a -digital output, then if this is connected to the digital input terminal 27 by an optical cable, then digital dubbing can be performed by the external CD player or the like.

Further, a USB (Universal Serial Bus) connector 28 is provided on the drive apparatus 20 so as to allow various types of communication or data transmission between the drive apparatus 20 and an apparatus which is ready for the USB such as, for example, a personal computer having a USB interface.

Further, while the drive apparatus 20 of the present embodiment obtains operation power supply from an external commercial ac power supply through a power supply plug 29, for example, a dry cell or a charged battery may alternatively be mounted as an operation power supply in the drive apparatus 20.

It is to be noted that the types, numbers and locations of the terminals mentioned above are mere examples at all and may be different from those described above.

For example, a digital output terminal ready for an optical cable may be provided, or a SCSI connector, a serial port, an RS232C connector, an IEEE connector or the like may be formed on the drive apparatus 20.

Further, although the terminal structure is not described particularly because it is already known in the art, it is otherwise possible to form the headphone terminal 23 and the line output terminal 24 described above as a common single terminal or further the terminal may be for common use with a digital output terminal.

Similarly, the microphone input terminal 25, line input terminal 26 and digital input terminal 27 may be formed as a single terminal.

An operation section 58 for being operated by a user is formed on the drive apparatus 20, and various operation elements are provided on the operation section 58. For example, a power on/off key, a reproduction key, a stop key, a pause key, a recording key, a fast feeding key, a rewinding key, a repeat key, a volume up key, a volume down key, an editing key, a menu key, an operation mode setting key and so forth may be provided.

Naturally, the operation keys mentioned above are mere examples. In other words, the number, types and positions of the operation members to be disposed may vary, and various other operation members such as, for example, cursor moving keys, numeral keys, and an operation dial (jog dial) which can be depressed and rotated may be provided additionally.

It is to be noted that, while the drive apparatus 20 shown is formed as an apparatus of the stationary type, since the plate-shaped memory 1 is a very small medium as described hereinabove with reference to FIG. 1, the drive apparatus 20 can still be formed with a small size even if it has a plurality of inlet openings for loading plate-shaped memory 1 therein. Accordingly, the drive apparatus 20 may otherwise be formed as a drive apparatus which is small in size, light in weight and portable.

Figure 6:
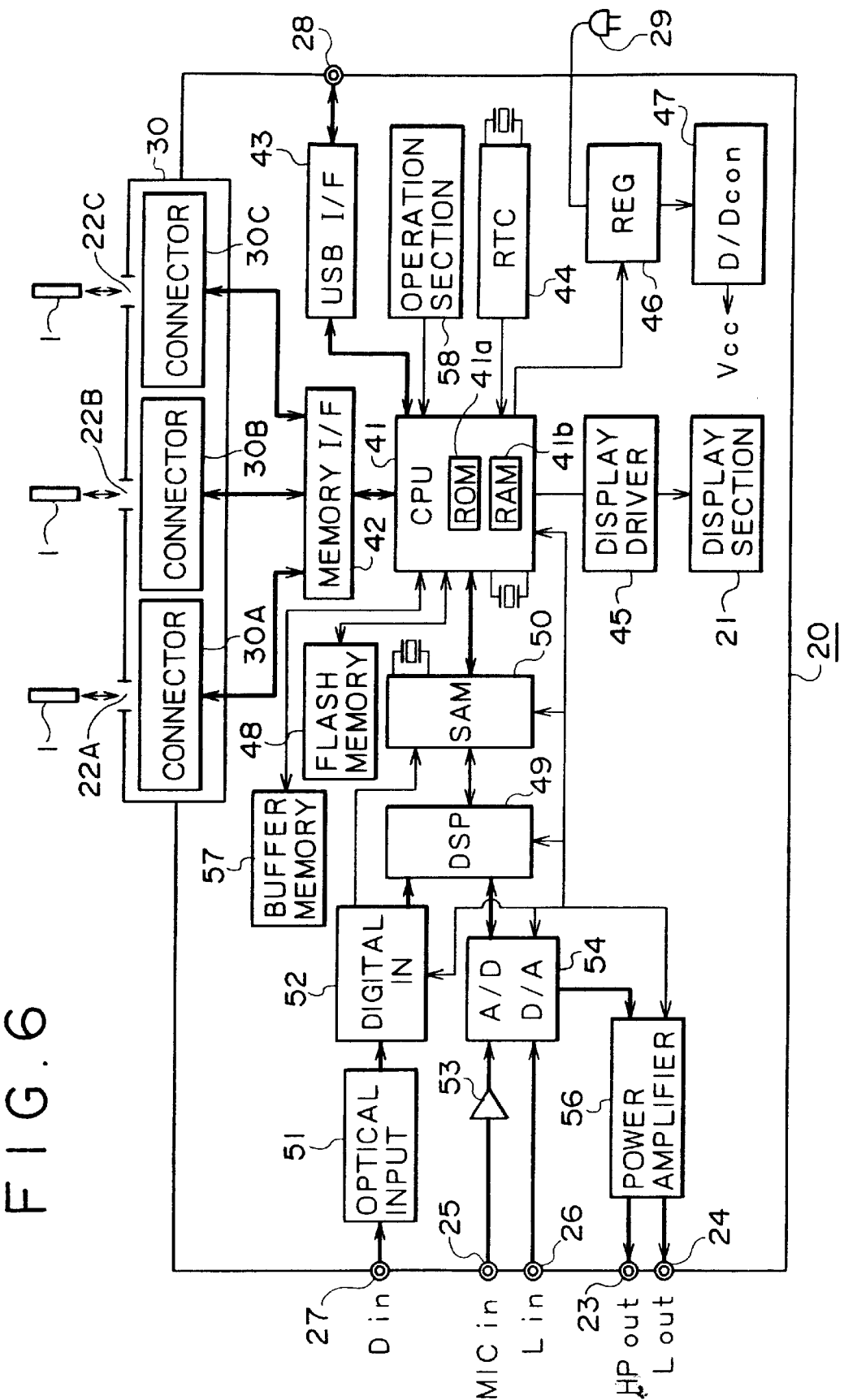
FIG. 6 is a block diagram showing an electric construction of the drive apparatus of FIG. 5.

FIG. 6 shows an internal construction of the drive apparatus 20.

Referring to FIG. 6, a CPU 41 serves as a central control unit of the drive apparatus 20 and controls operations of the components of the drive apparatus 20 described below.

A ROM 41a in which, for example, an operation program and various constants are stored and a RAM 41b which serves as a working area are provided in the CPU 41.

The CPU 41 executes control operations defined by the operation program of the ROM 41a in response to operation input information from the operation section 58 on which the various operation members are provided as described above.

The drive apparatus 20 further includes a flash memory 48. The CPU 41 can store system setting information regarding various operations such as a music recording mode, a reproduction volume and a display mode into the flash memory 48.

Also a buffer memory 57 formed from, for example, a D-RAM is provided. The CPU 41 can temporarily store data into the buffer memory 57 upon recording or reproduction operation into or from a plate-shaped memory 1. In the present embodiment, the buffer memory 57 is used, for example, in processing of a transfer mode, which is hereinafter described.

A real time clock 44 is a clock section and counts the present date. The CPU 41 confirms the present date depending upon date data from the real time clock 44.

A USB interface 43 is a communication interface with an external apparatus connected to the USB connector 28. The CPU 41 can communicate data with an external computer or a like external apparatus through the USB interface 43. For example, transmission or reception of control data, computer data, video data or audio data is executed through the USB interface 43.

The drive apparatus 20 further includes a regulator 46 and a DC/DC converter 47 as s power supply section. In order to make power supply available, the CPU 41 sends a power supply switch-on instruction to the regulator 46. The regulator 46 performs rectification/smoothing of an ac voltage supplied thereto through the power supply plug 29 in accordance with the instruction.

The power supply voltage from the regulator 46 is converted into a required voltage by the DC/DC converter 47 and supplied as an operation power supply voltage Vcc to the component blocks of the drive apparatus 20.

The insides of the three inlet openings 22A, 22B and 22C described hereinabove are formed as the connector section 30. In the connector section 30, three connectors 30A, 30B and 30C corresponding to the inlet openings 22A, 22B and 22C, respectively, are formed.

Each of the connectors 30A, 30B and 30C has a 10-terminal structure corresponding to the structure of the terminal section 2 of the plate-shaped memory 1 described above. It is to be noted that, on the right hand side of the connector 30A of FIG. 7, the corresponding terminals T1 to T10 of the plate-shaped memory 1 shown in FIG. 2 are additionally indicated.

When the plate-shaped memory 1 is connected to any or each one of the connectors 30A, 30B and 30C, the CPU 41 can access the plate-shaped memory 1 connected to the connector section 30 through a memory interface 42 so that it can execute recording/reproduction/editing of various data.

The CPU 41 can control a display driver 45 so that the display section 21 may display a required image. For example, a menu or a guide display for an operation of a user, contents of a file recorded in the plate-shaped memory 1 and so forth are displayed on the display section 21. Further, for example, if image data of moving pictures or still pictures are recorded in the plate-shaped memory 1, it is possible to read out the image data and display them on the display section 21.

As described above, in the drive apparatus 20 of the present embodiment, in order to allow inputting and outputting of an audio signal (music signal and sound signal), the digital input terminal 27, microphone input terminal 25, line input terminal 26, headphone terminal 23 and line output terminal 24 are formed.

The drive apparatus 20 further includes, as an audio signal processing system for the terminals mentioned, a SAM (Security Application Module: encryption/decryption processing section) 50, a DSP (Digital Signal Processor) 49, an analog to digital/digital to analog conversion section (hereinafter referred to as ADDA conversion section) 54, a power amplifier 56, a microphone amplifier 53, an optical input module 51 and a digital inputting section 52.

The SAM 50 performs encryption and decryption of data between the CPU 41 and the DSP 49 and communicates a cryptographic key with the CPU 41. The cryptographic key is stored, for example, in the flash memory 48. The SAM 50 can use the cryptographic key to perform encryption/decryption.

It is to be noted that the encryption/decryption by the SAM 50 may be performed, for example, for data other than music data.

Encryption or decryption by the SAM 50 can be executed in accordance with an instruction of the CPU 41, for example, when data is to be transferred to or is received from an external personal computer through the USB interface 43.

The DSP 49 performs compression/decompression processing of audio data based on a command of the CPU 41.

The digital inputting section 52 performs input interface processing of digital audio data fetched by the optical input module 52.

The ADDA conversion section 54 performs A/D conversion and D/A conversion of an audio signal.

An audio signal is inputted and outputted in the following manner by these blocks described above.

A signal supplied as digital audio data from an external apparatus (such as, for example, a CD player) to the digital input terminal 27 over an optical cable is photo-electrically converted and fetched by the optical input module 51 and undergoes reception processing in accordance with a transmission format in the digital inputting section 52. Then, the received and extracted digital audio data are compressed by the DSP 49 and supplied to the CPU 41, by which they are converted into, for example, recording data to be recorded into a plate-shaped memory 1.

If a microphone is connected to the microphone input terminal 25, then an input sound signal from the microphone through the microphone input terminal 25 is amplified by the microphone amplifier 53 and A/D converted by the ADDA conversion section 54, and then supplied as digital audio data to the DSP 49. The digital audio data is compressed by the DSP 49 and supplied to the CPU 41, by which it is converted into, for example, recording data to be recorded into a plate-shaped memory 1.

An input sound signal from an external apparatus connected to the line input terminal 26 is A/D converted by the ADDA conversion section 54 and supplied as digital audio data to the DSP 49. The digital audio data are a compressed by the DSP 49 and then supplied to the CPU 41, by which they are converted into, for example, recorded data to be recorded into a plate-shaped memory 1.

On the other hand, for example, when audio digital data read out from a plate-shaped memory 1 are to be outputted, the CPU 41 decompresses the audio data by the DSP 49 thereof. The digital audio data after such processing are converted into an analog audio signal by the ADDA conversion section 54 and supplied to the power amplifier 56.

The power amplifier 56 performs amplification processing for a headphone and amplification processing for a line output of the analog audio signal and supplies resulting signals to the headphone terminal 23 and the line output terminal 24, respectively.

Figure 7:
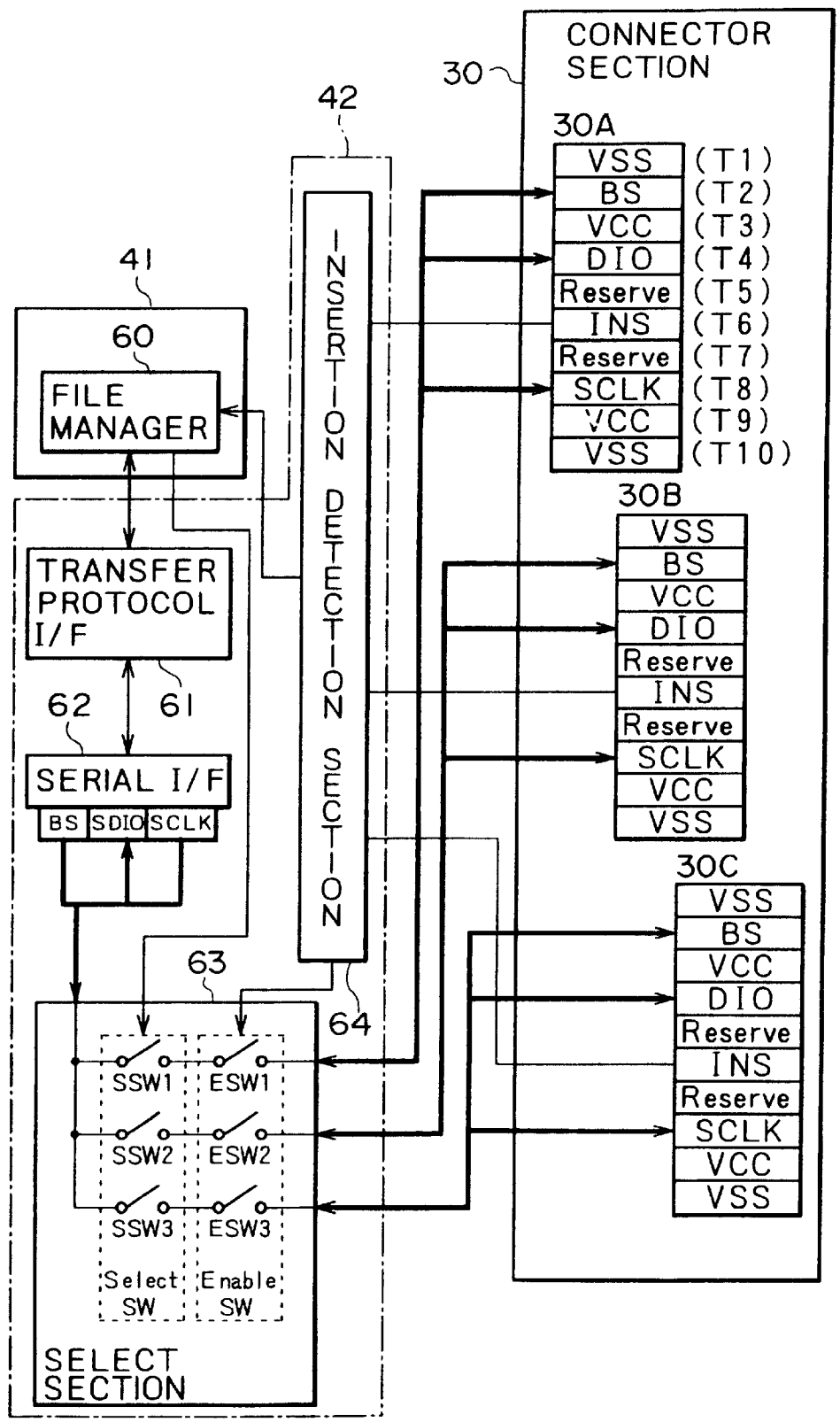
FIG. 7 is a block diagram showing an interface structure of the drive apparatus of FIG. 5.

FIG. 7 shows a construction for an interface with the plate-shaped memory 1. The interface is a portion which is formed from the CPU 41, memory interface 42 and connector section 30 of FIG. 6.

As described above with reference to FIG. 4, as an interface structure of the drive apparatus 20 side, the file manager 60, transfer protocol interface 61 and serial interface 62 are provided. The interface structure is formed by hardware or software in the CPU 41 and the memory interface 42 as seen in FIG. 7.

As described above, the serial interface 62 performs transfer of various data over the three signal lines SCLK (serial clock), BS (bus state) and SDIO (serial data input/output) with the serial interface 10*d* (refer to FIG. 4) of the plate-shaped memory 1. The signal lines are led to the connectors 30A, 30B and 30C through a select section 63 as shown in FIG. 7.

When the plate-shaped memory 1 having such a terminal structure as shown in FIG. 2 is loaded into any of the connectors 30A, 30B and 30C, connections of the signal lines SCLK (serial clock), BS (bus state) and SDIO (serial data input/output) are established between the serial interface 62 of the drive apparatus 20 and the serial interface 10*d* in the plate-shaped memory 1.

However, signal line connection for interfacing with the serial interface 62 is established only to that one of the connectors which is selected by the select section 63.

In particular, the select section 63 includes three select switches SSW1, SSW2 and SSW3 and three enable switches ESW1, ESW2 and ESW3. The select switch SSW1 and the enable switch ESW1 are disposed on the signal line to the connector 30A.

Further, the select switch SSW2 and the enable switch ESW2 are disposed on the signal line to the connector 30B, and the select switch SSW3 and the enable switch ESW3 are disposed on the signal line to the connector 30C.

The select section 63 having such a switch construction as described above selectively determines one of the connector sections which is to be connected to the serial interface 62.

For example, in order to access the plate-shaped memory 1 loaded in the connector 30A, the select section 63 selectively switches on the select switch SSW1 and the enable switch ESW1 but does not select the other switches.

The select switches SSW1, SSW2 and SSW3 are switched on/off under the control of the file manager 60. In particular, in order to select a necessary connector for a plate-shaped memory 1 to be accessed, the file manager 60 selects one of the select switches SSW1, SSW2 and SSW3.

On the other hand, the enable switches ESW1, ESW2 and ESW3 are provided in order to prevent selection of any connector in which no plate-shaped memory 1 is loaded.

As described above with reference to FIG. 3, the drive apparatus 20 can detect a loaded condition of a plate-shaped memory 1 in the connector section 30 by detecting a terminal voltage of the detection terminal T6 in the terminal section 2 of the plate-shaped memory 1.

More particularly, in FIG. 7, an insertion detection section 64 detects terminal voltages of detection terminals INS (terminals corresponding to the detection terminal T6 of the plate-shaped memory 1) of the connectors 30A, 30B and 30C, and based on the terminal voltages, the insertion detection section 64 detects whether or not a plate-shaped memory 1 is loaded in each of the connectors 30A, 30B and 30C.

The insertion detection section 64 supplies detection information to the file manager 60 so that the file manager 60 may discriminate that one of the connectors which is currently valid, that is, that one of the connectors which can access a plate-shaped memory 1.

Further, the insertion detection section 64 controls the enable switches ESW1, ESW2 and ESW3 in response to the detection information. In particular, the insertion detection section 64 controls the enable switches ESW1, ESW2 and ESW3 such that any of them which corresponds to a connector in which a plate-shaped memory 1 is loaded is switched on, but any of them which corresponds to a connector in which no plate-shaped memory 1 is loaded is switched off.

Consequently, any connector in which no plate-shaped memory 1 is loaded and the serial interface 62 are not connected to each other.

It is to be noted that the enable switches ESW1, ESW2 and ESW3 may alternatively be controlled by the file manager 60.

Meanwhile, if the control system for the select switches SSW1, SSW2 and SSW3 by the file manager 60 is modified such that on-control of a select switch which corresponds to any connector in which no plate-shaped memory 1 is loaded is inhibited, then the enable switches can be omitted.

The drive apparatus 20 of the present embodiment has such a construction as described above. As can be recognized from the construction, the drive apparatus 20 allows loading of a plurality of plate-shaped memories 1 and can perform recording and/or reproduction operations for each of the plate-shaped memories 1.

Further, in order to change over that one of the plate-shaped memories 1 loaded in the drive apparatus 20 which is to be accessed, in regard to hardware, only it is required to change over the connector selection state of the select section 63, and a member for physically moving a storage medium in order to exchange a medium to be accessed or another member for keeping those media which are not an object of accessing in position as in a conventional CD changer player is not required.

Furthermore, even if such a continuous operation for a plurality of plate-shaped memories as described above is performed, an appropriate operation can be realized in that an intermittent reproduction output in time is prevented and so forth.

Further, since any connector in which no plate-shaped memory 1 is loaded is prevented from being selected in response to detection of a loaded condition by the insertion detection section 64, an invalid selection state can be prevented, and consequently, an efficient operation can be achieved.

It is to be noted that the construction of the drive apparatus 20 described hereinabove with reference to FIGS. 6 and 7 is a mere example at all and the construction of the drive apparatus 20 is not limited to the specific one described above.

For example, it is also possible to build a speaker for outputting audio data inside of the drive apparatus 20 and supply an output of the power amplifier 56 to the speaker so that the speaker outputs corresponding sound.

Further, although the following description regarding operations of the drive apparatus 20 of the present embodiment in various modes are given taking audio data as an example of main data which makes an object of the operations, the drive apparatus 20 can handle not only audio data but also other various data such as image data as described above and the various operations described below can be applied also to such various data.

4. Continuous Reproduction Mode Operation

First, a continuous reproduction mode operation which can be realized by the drive apparatus 20 is described.

It is to be noted that, while the various operation modes are described below, it is assumed that data to be written into or read out from a plate-shaped memory 1 are audio data and that music data of one tune as audio data are stored as one track in the plate-shaped memory 1 and managed with a unique track number applied thereto.

Figure 8:
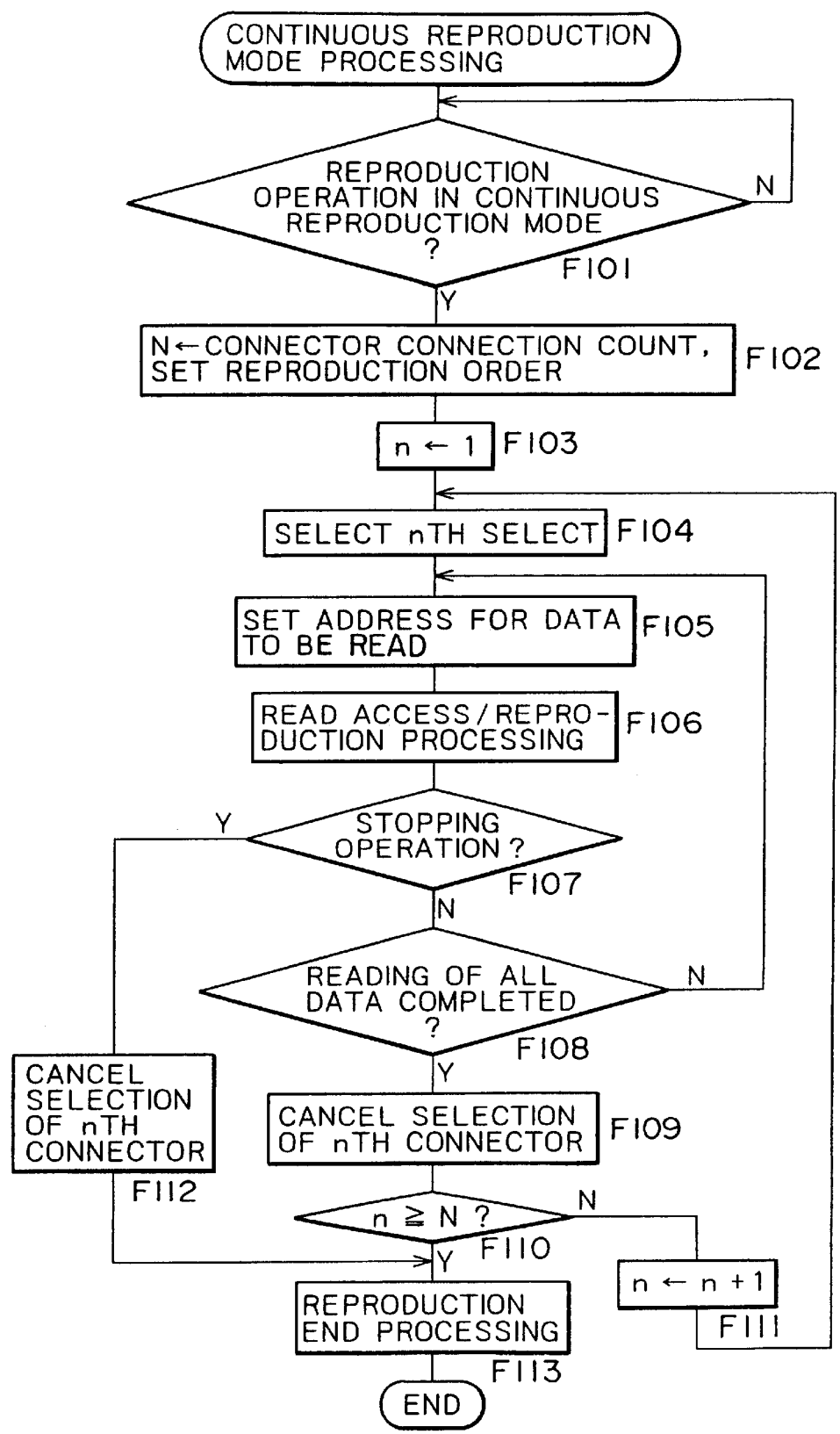
FIG. 8 is a flow chart illustrating continuous reproduction mode processing of the drive apparatus of FIG. 5.

FIG. 8 illustrates processing of the CPU 41, that is, operation realized with the interface structure of FIG. 7 under the control of the file manager 60 in the CPU 41, in the continuous reproduction mode.

The continuous reproduction mode is operation of successively reproducing a plurality of plate-shaped memories 1 loaded in the drive apparatus 20.

A user can load two or more plate-shaped memories 1 into the connector section 30 and enter an instruction to perform a reproduction operation in the continuous reproduction mode.

If a user operates the operation section 58 to enter an instruction of reproduction according to the continuous reproduction mode, the CPU 41 advances its processing from step F101 to step F102 in FIG. 8, in which it sets a variable N to a connector connection count (the number of those connectors in which plate-shaped memories 1 are loaded) The connector connection count is the number of those connectors which are detected to have a plate-shaped memory 1 loaded therein by the insertion detection section 64. Since the drive apparatus 20 of the present embodiment can receive maximum three plate-shaped memories 1, the variable N is set to N=2 or N=3 (where N=1, the continuous reproduction mode operation is not executed, but normal reproduction of the single plate-shaped memory 1 loaded in the drive apparatus 20 can be performed).

Further, in step F102, a reproduction order of the plurality of plate-shaped memories 1 loaded in the connectors is set.

For example, where two plate-shaped memories 1 are loaded in the connectors 30A and 30C, the variable N is N=2, and the reproduction order is set in such a manner that the first connector (the plate-shaped memory 1 connected to the connector) is the connector 30A and the second connector (the plate-shaped memory 1 connected to the connector) is the connector 30C.

It is to be noted that various methods are available to determine the reproduction order. For example, it is possible to apply connector numbers to the connectors and determine the reproduction order so that those connectors in which plate-shaped memories are inserted may be played back in an ascending order of the connector numbers, or to determine the reproduction order at random, or else, the reproduction order may be designated by the user.

Then in step F103, a variable n is set to 1, and then in step F104, the CPU 41 controls the select section 63 to select the nth connector, that is, the connector whose reproduction order number is 1 because it has been determined to be played back first.

Consequently, an interface is established with the plate-shaped memory 1 to be played back first. Then in step F105, the CPU 41 performs setting of an address of data to be read, and in step F106, the CPU 41 executes reading accessing. The audio data thus read out are subject to required processing by the reproduction circuit section including the DSP 49, ADDA conversion section 54 and power amplifier 56 of FIG. 6 as reproduction processing and reproduces and outputs resulting audio data.

The read address setting in step F105 and the read accessing/reproduction processing in step F106 are performed either until it is detected in step F107 that a stopping operation is performed by the user or until it is discriminated in step F108 that the reproduction of data of all tracks of the plate-shaped memory 1 loaded in the connector whose reproduction order number has been determined to be 1 is completed.

If it is determined in step F108 that completion of reproduction of all of the tracks of the plate-shaped memory 1 loaded in the connector whose reproduction order number has been determined to be 1 is detected, then the processing advances to step F109, in which the CPU 41 controls the select section 63 to cancel the selection of the nth connector, that is, the connector whose reproduction order number is 1 and which has been selected till then.

Consequently, the interface with the plate-shaped memory 1 whose playback has been completed is cancelled.

Then in step F110, the CPU 41 discriminates whether or not the variable n is equal to the variable N. If the variable n is not equal to the variable N, or in other words, if there remains a plate-shaped memory 1 which has not been played back yet, then the variable n is incremented by 1 in step F111, and then the processing returns to step F104 so that similar processing to that described above is performed thereafter. In particular, the CPU 41 now controls the select section 63 to select that one of the connectors whose reproduction order number is 2, that is, that one of the connectors which should be played back second. Consequently, an interface with the plate-shaped memory 1 which should be played back second is established. Then, the CPU 41 performs read address setting in step F105 and the read accessing/reproduction processing in step F106 for the plate-shaped memory 1 which should be played back second.

If completion of the reproduction of all tracks of the plate-shaped memory 1 loaded in the connector whose reproduction order number is 2 is detected in step F108, then the processing advances to step F109, in which the CPU 41 controls the select section 63 to cancel the selection of the connector whose reproduction order number is 2. Consequently, the interface with the plate-shaped memory 1 whose reproduction is completed is cancelled.

Then, if the variable n does not reach the variable N in step F110, or in other words, if there remains a plate-shaped memory 1 which has not been reproduced as yet, then the variable n is incremented by 1 in step F111, and then the processing returns to step F104 so that processing similar to that described above is performed thereafter. Consequently, playback of the plate-shaped memory 1 loaded in the connector whose reproduction order number has been determined to be 3 is performed.

If two plate-shaped memories 1 are loaded in the connector section 30, then the processing advances from step F110 to step F113 at a point of time when reproduction of the two plate-shaped memories 1 is completed. On the other hand, if three plate-shaped memories 1 are loaded in the connector section 30, then the processing advances from step F110 to step F113 at a point of time when reproduction of the three plate-shaped memories 1 is completed.

On the other hand, the CPU 41 may alternatively control such that, if a repeat key is operated by the user, then, for example, when reproduction of the three plate-shaped memories 1 is completed, the CPU 41 sets the variable n to its initial value and returns its processing to step F104. Consequently, the three plate-shaped memories 1 are repetitively played back until a stopping operation is performed by the user.

Further, if a user performs a stopping operation while reproduction is proceeding, then the processing advances from step F107 to step F112, in which the CPU 41 controls the select section 63 to cancel the selection of the connector being currently selected, whereafter the processing advances to step F113.

In step F113, the CPU 41 performs necessary reproduction end processing to end the series of reproduction operation in the continuous reproduction mode.

By the processing described above, such continuous reproduction as in the following example is performed particularly.

For example, if two plate-shaped memories 1 are loaded into the connector 30A and 30C and the reproduction order is determined such that the plate-shaped memory 1 on the connector 30A side should be reproduced first and the plate-shaped memory 1 on the connector 30C side should be reproduced second, then the connector 30A is selected by the select section 63, and all tracks of the plate-shaped memory 1 loaded in the connector 30A are reproduced. Then, the selection by the select section 63 is changed over to the connector 30C, and all tracks of the plate-shaped memory 1 loaded in the connector 30C are reproduced. The continuous reproduction is completed with this.

On the other hand, for example, if three plate-shaped memories 1 are loaded into the connectors 30A, 30B and 30C and the reproduction order is set such that the plate-shaped memory 1 on the connector 30A side should be played back first and the plate-shaped memory 1 on the connector 30B side should be played back second and then the plate-shaped memory 1 on the connector 30C side should be played back third, then the connector 30A is selected first by the select section 63, and all tracks of the plate-shaped memory 1 loaded in the connector 30A are reproduced. Then, the selection by the select section 63 is changed over to the connector 30B, and all tracks of the plate-shaped memory 1 loaded in the connector 30B are reproduced. Further, the selection by the select section 63 is changed over to the connector 30C, and all tracks of the plate-shaped memory 1 loaded in the connector 30C are reproduced. The continuous reproduction is completed with this.

Continuous reproduction is executed for a plurality of plate-shaped memories 1, for example, in such a manner as described above. In the drive apparatus 20 of the present embodiment, in order to change over the plate-shaped memory 1 to be played back, only switching of the select section 63 is merely performed, and accordingly, much time is not required for changing over between media. Consequently, also when the plate-shaped memory of an object of playback is changed over, reproduction outputting of the first track of a next plate-shaped memory can be performed immediately after playback of the last track from a certain plate-shaped memory comes to an end, and continuous reproduction satisfactory to a user can be achieved.

5. Track Designation Reproduction Mode Operation and Other Reproduction Modes

Subsequently, track designation reproduction mode operation is described.

Figure 9:
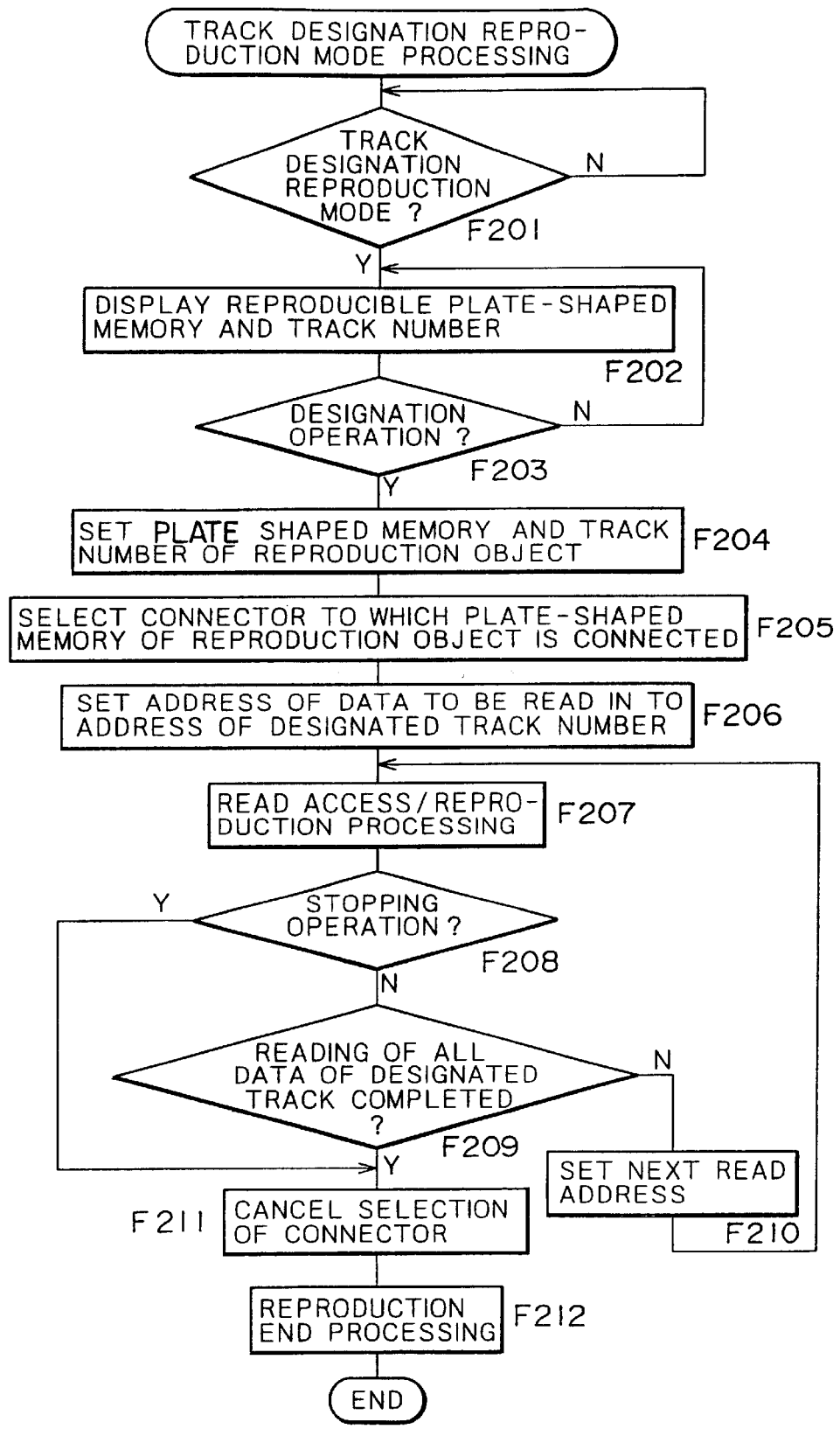
FIG. 9 is a flow chart illustrating track designation reproduction mode processing of the drive apparatus of FIG. 5.

FIG. 9 illustrates processing of the CPU 41 in the track designation reproduction mode, that is, operation by the interface structure of FIG. 7 under the control of the file manager 60 in the CPU 41.

The track designation mode signifies operation of a user designating a certain track of a single plate-shaped memory 1 loaded in the drive apparatus 20 or of a certain one of a plurality of plate-shaped memories 1 loaded in the drive apparatus 20 so that the designated track of the designated plate-shaped memory 1 may be played back.

A user can load at least one plate-shaped memory 1 into the connector section 30 to enter an instruction to perform reproduction operation in the track designation reproduction mode.

If the user operates the operation section 58 to enter an instruction to perform reproduction according to the track designation reproduction mode, then the CPU 41 advances its processing from step F201 in FIG. 9 to step F202, in which it controls the display section 21 to display a list of reproducible tracks and a request for designation to the user.

For example, the number of each of the plate-shaped memories 1 connected to the connector section 30 (the number allocated in such a manner that, for example, the plate-shaped memory 1 connected to the connector 30A is allocated as "medium 1" and the plate-shaped memory 1 connected to the connector 30B is allocated as "medium 2") is displayed, or where a title of a plate-shaped memory 1 is recorded in the plate-shaped memory 1, the title is displayed. Further, track numbers or track names stored in each of the plate-shaped memory 1 are displayed.

Then, a message to urge the user to designate a certain track in a certain plate-shaped memory 1 is displayed.

If the user performs an operation to designate a certain track of a certain plate-shaped memory 1, then the processing advances from step F203 to step F204, in which the CPU 41 starts actual reproduction processing in the track designation reproduction mode.

It is to be noted that such a list for designation of a track as described above may always be displayed. In particular, it is possible to normally execute displaying of a list of reproducible tracks at a point of time when no production is proceeding even if the processing (user operation) in step F201 is not performed and advance the processing of the CPU 41 to processing of the track designation reproduction mode in step F204 et seq. if the user selects a desired track from within the list. In this case, the mode instruction operation of the user is not required.

Further, if a selection key for selection of a plate-shaped memory 1 or ten keys are provided as operation keys and a certain track of a certain plate-shaped memory 1 can be designated directly by an operation of the operation keys, then such a list as described above may not necessary be displayed.

In step F204, the CPU 41 sets the plate-shaped memory 1 and the track number, which makes an object of reproduction, in response to the designation operation of the user.

Then in step F205, the CPU 41 controls the select section 63 to select the connector in which the plate-shaped memory 1 which has been determined as an object of reproduction is loaded.

Consequently, an interface with the plate-shaped memory 1 of the object of reproduction is established.

In step F206, the CPU 41 sets an address of the track of the object of reproduction as a read address, and in step F207, the CPU 41 executes read accessing. Audio data thus read out are subject to required processing by the reproduction system circuit sections of the DSP 49, ADDA conversion section 54 and power amplifier 56 of FIG. 6 as reproduction processing, and resulting data are reproduced and outputted.

The read accessing/reproduction processing in step F207 is performed until it is detected in step F208 that a stopping operation of the user is performed or until it is discriminated in step F209 that the reproduction of the track is completed.

In other words, during reproduction of a track, the reproduction of the track is continued in step F207 while the setting of the read address is successively updated in step F210.

If it is detected in step F209 that the data reading/reproduction outputting of the designated track is completed, then the processing advances to step F211, in which the CPU 41 controls the select section 63 to cancel the selection of the connector which has been selected till then.

Then in step F212, reproduction end processing is performed to end the reproduction operation in the track designation reproduction mode.

By such processing as described above, the user can reproduce only an arbitrary track from among tracks recorded in one or a plurality of plate-shaped memories 1 loaded in the drive apparatus 20.

In the present embodiment, when a selection condition of the select section 63 is set in response to a designation operation by a user, accessing to a plate-shaped memory 1 which makes an object of reproduction is enabled, and reproduction outputting of a designated track can be started immediately after the designation operation is performed.

Whereas some conventional CD changer system can allow designation of a desired CD and a desired track of the CD from among a plurality of media accommodated therein and allow reproduction of the desired track of the desired CD, in the CD changer system mentioned, the CD designated by the user must be transported to a position at which it can be played back, and the user must wait for a time during the transportation. In the drive apparatus 20 of the present embodiment, no such waiting time is required at all, and reproduction satisfactory to the user can be achieved.

It is to be noted that, while, in the example described above, a track is designated and reproduced, also an operation mode wherein designation is performed in a unit of a plate-shaped memory to reproduce it can be realized.

More particularly, in the operation mode just mentioned, when only a certain one of a plurality of plate-shaped memories 1 loaded in the drive apparatus 20 is designated by a user, all tracks recorded on the plate-shaped memory 1 are reproduced. Also in this instance, reproduction can naturally be started immediately after the designation operation of the user is performed.

Further, as a reproduction mode, programmed reproduction wherein a reproduction order is designated by a user, shuffle reproduction wherein the CPU 41 successively selects and reproduces tracks at random and so forth are available. In the programmed reproduction or the shuffle reproduction, a reproduction mode wherein a certain plate-shaped memory is designated and programmed reproduction or shuffle reproduction is executed within the range of tracks recorded in the designated plate-shaped memory and another reproduction mode wherein a plurality of plate-formed memories loaded are determined as an object of reproduction and programmed reproduction or shuffle reproduction is performed within tracks recorded on the plate-formed memories are available.

Also in the modes just mentioned (programmed reproduction wherein a plate-formed memory is designated, shuffle reproduction wherein a plate-formed memory is designated, programmed reproduction wherein a plurality of plate-formed memories are designated as an object of reproduction, and shuffle reproduction wherein a plurality of plate-formed memories are designated as an object of reproduction), reproduction can be started immediately after the designation of the user is performed.

In the programmed reproduction wherein a plurality of plate-formed memories are designated as an object of reproduction and the shuffle reproduction wherein a plurality of plate-formed memories are designated as an object of reproduction, a situation that the plate-formed memory of an object of accessing must be changed over at a point of time when reproduction of one tune (track) is completed sometimes occurs. However, since the changing over operation can be realized only by selective changing over of the select section similarly to the changing over operation in the continuous reproduction mode described hereinabove with reference to FIG. 8, no time is required for changing over of the plate-formed memory of an object of accessing, that is, no long silence period will appear with reproduction sound to be outputted.

In particular, in the programmed reproduction wherein a plurality of plate-shaped memories are determined as an object of accessing, no matter what order of the reproduction the user designates, immediately after reproduction of a certain track comes to an end, reproduction of a next track can be started.

On the other hand, in the shuffle reproduction wherein a plurality of plate-shaped memories are determined as an object of accessing, whichever track of plate-shaped memory is selected next, reproduction of the selected track can be started immediately.

Further, if the repeat key is selectively operated by the user, then after reading of all data of a designated track is completed, the read address is set to the top address of the first data of the designated track. Consequently, the designated data are repetitively reproduced until a stopping operation is performed by the user.

6. Transfer Mode Operation

Subsequently, the transfer mode operation is described.

The transfer mode operation is an operation of recording (copying), when a plurality of plate-shaped memories 1 are loaded, data (a track) recorded on a certain one of the plate-shaped memories 1 into another one of the plate-shaped memories 1.

Figure 10:
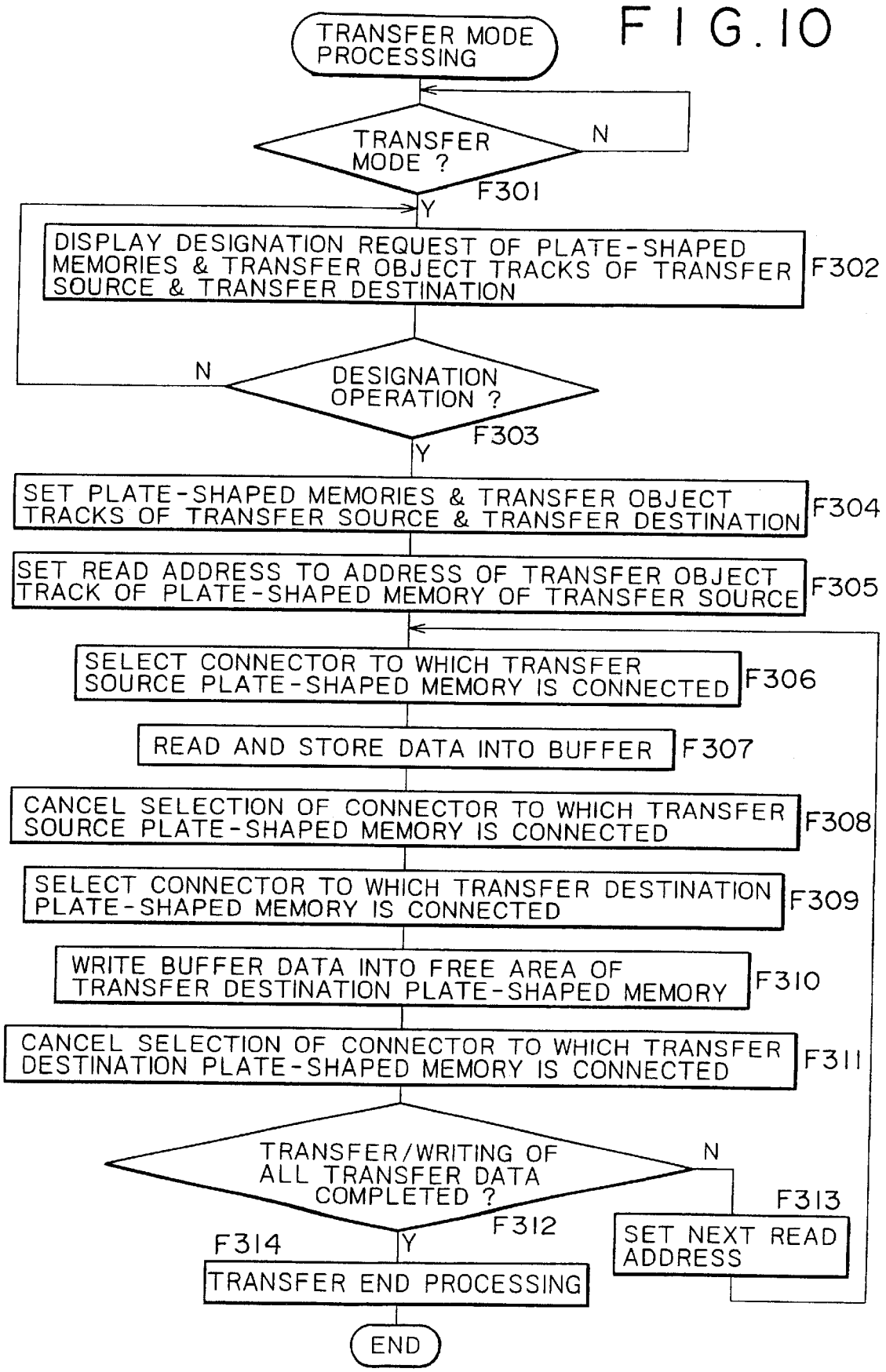
FIG. 10 is a flow chart illustrating transfer mode processing of the drive apparatus of FIG. 5.

FIG. 10 illustrates processing of the CPU 41 (file manager 60) in the transfer mode.

The user can load two or more plate-shaped memories 1 into the connector section 30 to enter an instruction to execute an operation in the transfer mode.

If the user operates the operation section 58 to enter an instruction of the transfer mode, then the CPU 41 advances its processing from step F301 to step F302 of FIG. 10, in which it controls the display section 21 to display a request to a user for designation of one of the plate-shaped memories 1 which should be a transfer source, another one of the plate-shaped memories 1 which should be a transfer destination and a track which includes transfer object data.

For example, numbers or titles of the plate-shaped memories 1 connected to the connector section 30 are displayed so that the user may select those plate-shaped memories which should be a transfer source and a transfer destination, and tracks recorded on the plate-shaped memory of the transfer source are displayed in a list so that the user may select one or a plurality of ones of the tracks as transfer object data.

After the user performs operations for designating them, the processing advances from step F303 to step F304, in which the CPU 41 sets one of the plate-shaped memories 1 which should be a transfer source, another one of the plate-shaped memories 1 which should be a transfer destination and a track or tracks which should be transfer object data in response to the designation operations of the user.

Then in step F305, the CPU 41 sets the address of the track or tracks of the transfer object of the plate-shaped memory 1 which has been determined as a transfer source to a read address.

Further, in step F306, the CPU 41 controls the select section 63 to select that one of the connectors in which the transfer source plate-shaped memory 1 is loaded so that an interface is established for the transfer source plate-shaped memory 1.

Then in step F307, the CPU 41 executes read accessing to the transfer source plate-shaped memory 1 and stores audio data successively read out from the transfer source plate-shaped memory 1 into the buffer memory 57. It is to be noted that the read processing here is performed in a unit of a data amount which does not exceed a data capacity which can be stored into the buffer memory 57.

After a certain unit amount of data of the transfer object track or tracks is stored into the buffer memory 57, the CPU 41 controls the select section 63 to cancel the selection condition of the transfer source plate-shaped memory 1 in step F308. Further in step F309, the CPU 41 now controls the select section 63 to select the connector in which the plate-shaped memory 1 of the transfer destination is loaded so that an interface is established for the transfer destination plate-shaped memory 1.

Then in step F310, the CPU 41 writes the data stored in the buffer memory 57 into a free area of the transfer destination plate-shaped memory 1.

After the writing of the data stored in the buffer memory 57 into the transfer destination plate-shaped memory 1 is completed, the CPU 41 controls the select section 63 to cancel the selection of the transfer destination plate-shaped memory 1 in step F311.

Then in step F312, the CPU 41 discriminates whether or not transfer of all data of the transfer object track (writing into the transfer destination plate-shaped memory 1) is completed. If the transfer is not completed, then the CPU 41 sets a next read address (address of the transfer source plate-shaped memory 1) in step F313, whereafter it repeats the processing beginning with step F306 described above.

In short, by the processing in steps F303 to F313, reading out from the transfer source plate-shaped memory 1 and writing into the transfer destination plate-shaped memory 1 are repetitively executed for each predetermined data amount unit which can be buffered.

If it is confirmed in step F312 that transfer of all data of the one or plurality of transfer object tracks is completed, then the processing advances to step F314, in which the CPU 41 performs transfer end processing, thereby ending the operation of the transfer mode.

By such processing as described above, if a user loads a plurality of plate-shaped memories, then copying of data from a certain one of the plate-shaped memories to another one of the plate-formed memories is allowed. Or, by erasing data of a transfer source after it is copied, a moving operation which realizes movement of data is also allowed.

Although changing over between accessing to the transfer source plate-shaped memory and accessing to the transfer destination plate-shaped memory is successively performed in order to perform data transfer as in the processing described above, since changing over of the accessing destination can be realized momentarily depending upon setting of the select section 63 as can be recognized from the description above, no time loss is involved in the changing over. Consequently, a transfer operation can be completed rapidly.

Further, that no time loss occurs no matter how many times changing over is performed signifies that there is no trouble if the amount of transfer data for each transfer operation (the amount of data to be read out/written per once) is set to a small data amount and consequently a very large number of times of changing over operations of the accessing destination become required.

This gives rise to an advantage that the capacity necessary for the buffer memory 57 can be minimized and contributes also to simplification of the apparatus construction and reduction in cost.

Further, that no time loss occurs even if transfer is performed while the accessing destination is changed over many times in a unit of a small data amount signifies that, even if the buffer memory capacity or the unit of data which can be processed once by the memory interface 42, the CPU 41 or the like is small, a large amount of data can be transferred without any time loss.

7. Continuous Recording Mode Operation

Subsequently, the continuous recording mode operation is described.

The continuous recording mode operation is an operation of recording, where a plurality of plate-shaped memories 1 are loaded, data onto the plurality of plate-shaped memories 1, for example, when it is desired to record a comparatively large amount of data or when it is desired to efficiently utilize free areas of the plate-shaped memories 1.

Figure 11:
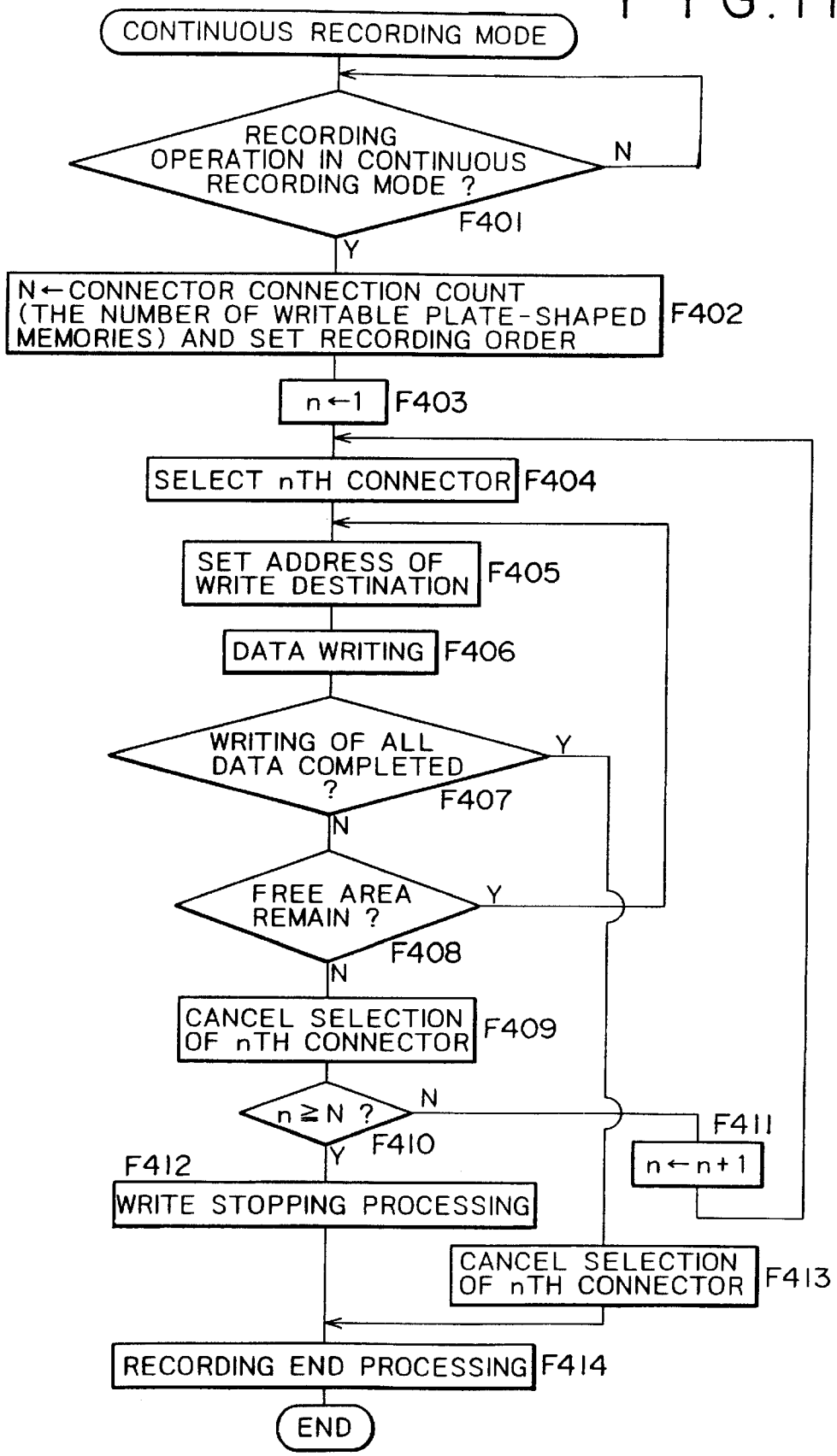
FIG. 11 is a flow chart illustrating continuous recording mode processing of the drive apparatus of FIG. 5.

FIG. 11 illustrates processing of the CPU 41 (file manager 60) in the continuous recording mode.

A user can load two or more plate-shaped memories 1 into the connector section 30 to enter an instruction to execute an operation in the continuous recording mode.

If the user operates the operation section 58 to enter an instruction to execute recording in the continuous recording mode, then the CPU 41 advances its processing from step F401 of FIG. 11 to step F402, in which it sets a variable N to a connector connection count (the number of those connectors in which recordable plate-shaped memories 1 are loaded).

In particular, the connector connection count is the number of connectors which are detected to have a plate-shaped memory 1 loaded therein by the insertion detection section 64. Here, any connector in which a plate-shaped memory 1 which cannot be recorded is loaded is excepted. For example, any connector in which a plate-shaped memory 1 to which inhibition of writing is set by the slide switch 5 for prevention of erroneous erasure shown in FIG. 9 is loaded or any connector which is not set to inhibit writing but in which a plate-shaped memory 1 having no free capacity is loaded is excepted. Accordingly, when a continuous recording operation is to be performed, a user must load at least two writable plate-shaped memories 1.

Further, in order to exclude any plate-shaped memory 1 which cannot be recorded during a continuous recording operation, the CPU 41 must confirm the state of the slide switch 5 or a free capacity of each plate-shaped memory 1 when the plate-shaped memory 1 is loaded.

In the present embodiment, since maximum three plate-shaped memories 1 can be loaded, the number N of connectors in which a plate-shaped memory 1 which can be recorded is loaded is N=2 or N=3 (when N=1, the continuous recording operation is not executed, but normal recording onto the single plate-shaped memory 1 loaded can be performed).

Further, in this step F402, the CPU 41 sets a recording order of the plurality of plate-shaped memories 1 (connectors) loaded.

For example, where those plate-shaped memories 1 which can be recorded are loaded in the connectors 30A and 30C, the variable N is N=2, and the recording order is set in such a manner that the first connector (the plate-shaped memory 1 connected to the connector) in the order is the connector 30A and the second connector (the plate-shaped memory 1 connected to the connector) is the connector 30C.

It is to be noted that various methods are available to determine the recording order similarly as upon setting of the reproduction order in the continuous reproduction operation described hereinabove. For example, it is possible to apply connector numbers to the connectors and determine the recording order so that those connectors in which plate-shaped memories are inserted may be played back in an ascending order of the connector numbers, or to determine the recording order at random, or else, the recording order may be designated by the user.

Then in step F403, a variable n is set to 1, and then in step F404, the CPU 41 controls the select section 63 to select the nth connector, that is, the connector whose recording order number is 1 because it has been determined to be played back first.

Consequently, an interface is established for the plate-shaped memory 1 to be record first. Then in step F405, the CPU 41 performs setting of an address of a writing address destination, and in step F406, the CPU 41 executes reading accessing.

For example, those of audio data inputted from the digital input terminal 27, line input terminal 26, microphone input terminal 25 or the like and processed by the DSP 49 or the like or various data inputted through the USB interface 43 which have been determined to be recorded by the user are written into the plate-shaped memory 1.

The read address setting in step F405 and the write accessing in step F406 are performed either until it is detected in step F407 that completion of writing of all data is detected or until it is discriminated in step F408 that the plate-shaped memory 1 loaded in the connector whose recording order number is 1 has no recordable free area therein any more.

If it is determined in step F408 that the plate-shaped memory 1 loaded in the connector whose recording order number is 1 has no recordable free area therein, then the processing advances to step F409, in which the CPU 41 controls the select section 63 to cancel the selection of the nth connector, that is, the connector whose recording order number is 1 and which has been selected till then.

Consequently, the interface with the plate-shaped memory 1 whose further recording is impossible is cancelled.

Then in step F410, the CPU 41 discriminates whether or not the variable n is equal to the variable N. If the variable n is not equal to the variable N, or in other words, if there remains a plate-shaped memory 1 which can be recorded, then the variable n is incremented by 1 in step F411, and then the processing returns to step F404 so that similar processing to that described above is performed thereafter. In particular, the CPU 41 now controls the select section 63 to select that one of the connectors whose recording order number is 2, and consequently, an interface with the plate-shaped memory 1 which should be recorded second is established. Then, the CPU 41 performs write address setting in step F405 and the write accessing in step F406 for the plate-shaped memory 1 which should be recorded second.

If it is determined in step F408 that the plate-shaped memory 1 loaded in the connector whose recording order number is 2 has no free area any more therein, then the processing advances to step F409, in which the CPU 41 controls the select section 63 to cancel the selection of the connector whose recording order number is 2. Consequently, the interface with the plate-shaped memory 1 whose further recording is impossible is cancelled.

Then, if the variable n does not reach the variable N in step F410, or in other words, if there remains a plate-shaped memory 1 which can be recorded, then the variable n is incremented by 1 in step F411, and then the processing returns to step F404 so that processing similar to that described above is performed thereafter. Consequently, recording of the plate-shaped memory 1 loaded in the connector whose recording order number has been determined to be 3 is performed.

While continuous recording onto the two or three plate-shaped memories 1 proceeds by the processing till now, depending upon the amount of data to be recorded and the situation of the free capacities of the plate-shaped memories 1, it is discriminated in step F407 that writing of all data is completed at a certain point of time after first writing into the plate-shaped memory 1 is started. In this instance, the processing of the CPU 41 advances from step F407 to step F413, in which the selection of the currently selected connector is cancelled, whereafter the processing advances to step F414.

In step F414, the CPU 41 executes necessary recording end processing, thereby ending the recording operation in the continuous recording mode.

Although the recording operation is ended normally, if the amount of data to be recorded is larger than a total capacity of the free areas of all of the recordable plate-shaped memories 1 loaded in the drive apparatus 20, then all data cannot be recorded into the plate-shaped memories 1.

In such an instance, it is discriminated at a certain point of time in step F410 that the variable n reaches the variable N. In short, although writing of all data is not completed, there remains no writable plate-shaped memory 1 any more. In this instance, writing stopping processing is performed in step F412. For example, a message "DATA FULL" is displayed on the display section 21 to report to the user that it is impossible to continue writing any more, and the recording operation is stopped. Then, end processing is performed in step F414, thereby ending the processing.

It is to be noted that, although it is not illustrated in the flow chart of FIG. 11, if the user performs a stopping operation during the recording operation, then the selection of the currently selectively used connector is cancelled and end processing is performed, thereby ending the operation.

By the processing described above, such continuous reproduction as in the following example is performed particularly.

For example, if recordable plate-shaped memories 1 are loaded into the connector 30A and 30C and the reproduction order is determined in such a manner that the plate-shaped memory 1 on the connector 30A side should be reproduced first and the plate-shaped memory 1 on the connector 30C side should be reproduced second, then the connector 30A is selected by the select section 63, and recording of data into the plate-shaped memory 1 loaded in the connector 30A is executed. If it is detected in the writing procedure into the first plate-shaped memory 1 that writing of all data is completed or if a stopping operation is performed by the user, then the continuous recording mode operation is ended. However, if some data to be written remain even after the free area of the plate-shaped memory 1 is used up, then the selection of the select section 63 is changed over to the connector 30C and data recording is executed into the plate-shaped memory 1 loaded in the connector 30C. If it is determined in the writing procedure into the second plate-shaped memory 1 that writing of all data is completed or if a stopping operation is performed by the user, then the continuous recording mode operation is ended. However, if some data to be written remain even after the free capacity of the plate-shaped memory 1 is used up, since any further writing is impossible, the recording operation is stopped and ended.

On the other hand, if three recordable plate-shaped memories 1 are loaded into the connectors 30A, 30B and 30C and the reproduction order is set in such a manner that the plate-shaped memory 1 on the connector 30A side should be played back first and the plate-shaped memory 1 on the connector 30B side should be played back second and then the plate-shaped memory 1 on the connector 30C side should be played back third, then the connector 30A is selected first by the select section 63, and recording of data into the plate-shaped memory 1 loaded in the a connector 30A is executed. If it is detected in the writing procedure into the first plate-shaped memory 1 that writing of all data is completed or if a stopping operation is performed by the user, then the continuous recording mode operation is ended. However, if some data to be written still remain even after the free area of the plate-shaped memory 1 is used up, the connector 30B is selected now by the select section 63, and data recording is executed into the plate-shaped memory 1 loaded in the connector 30B. If it is detected in the writing procedure into the second plate-shaped memory 1 that writing of all data is completed or if a stopping operation is performed by the user, then the continuous recording mode operation is ended. However, if some data to be written still remain even after the free area of the plate-shaped memory 1 is used up, the selection of the select section 63 is changed over to the connector 30C and data recording is executed into the plate-shaped memory 1 loaded in the connector 30C. If it is determined in the writing procedure into the third plate-shaped memory 1 that writing of all data is completed or if a stopping operation is performed by the user, then the continuous recording mode operation is ended. However, if some data to be written remain even after the free capacity of the plate-shaped memory 1 is used up, since any further writing is impossible, the recording operation is stopped and ended.

Continuous reproduction is executed for a plurality of plate-shaped memories 1 in such a manner as described above. In the drive apparatus 20 of the present embodiment, in order to change over the plate-shaped memory 1 to be recorded, only switching of the select section 63 is merely performed, and accordingly, not so much time is required for changing over between media. Consequently, also when stream data supplied continuously in time to the drive apparatus 20 such as, for example, audio data or moving picture data are to be recorded, a buffer memory of such a large capacity that data are buffered in order to prevent interruption of data which arises from time required for changing over between media is not required.

Further, by such a continuous recording operation as described above, it is possible to continuously record a very large amount of data. The drive apparatus 20 of the present embodiment is suitable for an application to record, for example, sound of a radio broadcast or a television program for a long period.

While the embodiment of the present invention is described above, the present invention is not limited to the construction and operation of the embodiment described above, but various modifications are possible particularly with regard to particular procedures of processing in the various mode operations described above.

Further, the recording medium used by the drive apparatus of the present invention is not limited to such a plate-shaped memory as shown in FIG. 1, but a semiconductor memory medium of any outer profile such as a memory chip, a memory card or a memory module may be used instead. Naturally, the memory device is not limited to a flash memory, and any other memory device may be used.

Further, a magnetic memory, an optical memory or another memory may be used in place of a semiconductor memory, and the present invention can be applied to any recording medium which does not require dynamic driving in writing/reading out of data.

Furthermore, while the embodiment described above is described particularly in connection with recording/reproduction of audio data of music, sound or the like, the object data is not limited to a track as music data, and the present invention can be applied quite similarly to any of moving picture data, still picture data, document data, control data and so forth.

While a preferred embodiment of the present invention has been described using specific terms, such description is for illustrative purposes only, and it is to be understood that changes and variations may be made without departing from the spirit or scope of the following claims.

What is claimed is:

1. A drive apparatus for writing and/or reading out data into and from a storage medium including a memory element, the apparatus comprising:

loading means for loading a plurality of storage media having a plate-shaped housing, wherein data are individually written into and/or read out from each of the plurality of storage media;

accessing means for accessing the plurality of storage media loaded in said loading means to write and/or read out the data into and from the plurality of storage media;

control means for controlling, when said plurality of storage media are loaded in said loading means, said accessing means to continuously perform writing into and/or reading out from said plurality of storage media loaded in said loading means; and readout order setting means for setting a readout order of the data stored in the plurality of storage media, wherein said control means controls said accessing means to successively access the data in accordance with the readout order set by said readout order setting means to continuously perform reading out of the data.

2. The drive apparatus according to claim 1, further comprising selection means for causing said accessing means to selectively access one of the plurality of storage media loaded in said loading means.

3. The drive apparatus according to claim 2, further comprising loading detection means for detecting whether a storage medium of said plurality of storage media is loaded in each of a plurality of storage medium loading portions of said loading means, wherein said selection means invalidates accessing by said accessing means to any of said storage medium loading portions in which said loading detection means detects that no storage medium is loaded.

4. The drive apparatus according to claim 2, further comprising loading detection means for detecting whether a storage medium of said plurality of storage media is loaded in each of a plurality of storage medium loading portions of said loading means, wherein said selection means allows accessing by said accessing means to any of said recording medium loading portions in which said loading detection means detects that any of said plurality of storage media is loaded.

5. The drive apparatus according to claim 1, wherein said readout order setting means sets the readout order of the data stored in said plurality of storage media in a unit of a storage medium.

6. The drive apparatus according to claim 1, wherein each of the data stored in said plurality of storage media is stored as one track, and said readout order setting means sets the readout order of the data stored in said plurality of storage media in a unit of a track.

7. The drive apparatus according to claim 1, further comprising storage medium selection means for selecting a first storage medium and a second storage medium from among said plurality of storage media loaded in said loading means, wherein said control means controls said accessing means to access said first storage medium to read out data stored in said first storage medium and then to access said second storage medium to write the data into said second storage medium.

8. The drive apparatus according to claim 2, further comprising storage medium selection means for selecting a first storage medium and a second storage medium from among said plurality of storage media loaded in said loading means, and buffer means being accessed by said accessing means for temporarily storing data read out from any of the plurality of recording media, wherein said control means controls said selection means and said accessing means so that said selection means first selects said first storage medium to allow accessing of the first storage medium by said accessing means and said accessing means accesses the first storage medium to read out data stored in the first storage medium and store the data into said buffer means, and then said selection means selects said second storage medium to allow accessing to the second storage medium and said accessing means accesses said second storage medium to write the data stored in said buffer means into the second storage medium.

9. The drive apparatus according to claim 1, further comprising writing order setting means for setting a writing order of said plurality of storage media when data are stored into the storage media, wherein said control means controls said accessing means to successively access the storage media in accordance with the writing order set by said writing order setting means to continuously perform writing of the data into said plurality of storage media in accordance with the writing order set by said writing order setting means.

10. The drive apparatus according to claim 2, further comprising writing order setting means for setting a writing order of said plurality of storage media when data are to be stored into the plurality of storage media, wherein said control means controls said selection means and said accessing means so that, in accordance with the writing order set by said writing order setting means, said selection means successively enables accessing to the storage media and said accessing means successively accesses the storage media, accessing to which is enabled by said selection means, to continuously perform writing of the data into said plurality of storage media.

11. The drive apparatus according to claim 9, further comprising detection means for detecting a free capacity of each of the plurality of storage media into which data is written by said accessing means, wherein, when said detection means detects that each of the plurality of storage media accessed by said accessing means in accordance with the writing order set by said writing order setting means has no free capacity, said control means controls said accessing means to access one of the storage media to be accessed next in accordance with the writing order, thereby to continuously perform writing of the data.

12. The drive apparatus according to claim 11, wherein, when said detection means detects that one of the plurality of storage media accessed last by said accessing means in accordance with the writing order set by said writing order setting means has no free capacity, then said control means controls said accessing means to end the writing into the plurality of storage media.

13. The drive apparatus according to claim 9, wherein the data are data inputted from an external data source.

14. The drive apparatus according to claim 13, wherein the data are broadcast data inputted from an external data source.

15. The drive apparatus according to claim 9, wherein said writing order setting means sets a writing order of said plurality of storage media in accordance with an order set in advance.

16. drive apparatus according to claim 9, wherein said writing order setting means sets a writing order of said plurality of storage media in response to an instruction given by a user of said drive apparatus.

17. The drive apparatus according to claim 1, wherein the plurality of storage media comprise a plurality of semiconductor memories.

18. A drive system for writing and/or reading out data into and from a storage medium having a memory element, the system comprising:
   a plurality of storage media having a plate-shaped housing;
   loading means for loading said plurality of storage media such that data are individually written into and/or read out from said plurality of storage media;
   accessing means for accessing said plurality of storage media loaded in said loading means to write and/or read out the data into and from said plurality of storage media;
   control means for controlling, when said plurality of storage media are loaded in said loading means, said accessing means to continuously perform writing into and/or reading out from said plurality of storage media loaded in said loading means; and
   readout order setting means for setting a readout order of the data stored in said plurality of storage media, wherein said control means controls said accessing means to successively access said plurality of storage media in accordance with the readout order set by said readout order setting means to continuously perform reading out of the data.

19. The drive system according to claim 18, further comprising selection means for causing said accessing means to selectively access one of said plurality of storage media loaded in said loading means.

20. The drive system according to claim 19, further comprising loading detection means for detecting whether a storage medium of said plurality of storage media is loaded in each of a plurality of storage medium loading portions of said loading means, wherein said selection means invalidates accessing by said accessing means to any of said storage medium loading portions in which said loading detection means detects that no storage medium is loaded.

21. The drive system according to claim 19, further comprising loading detection means for detecting whether a storage medium of said plurality of storage media is loaded in each of a plurality of storage medium loading portions of said loading means, wherein said selection means allows accessing by said accessing means to any of said recording medium loading portions in which said loading detection means detects that any of said plurality of storage media is loaded.

22. The drive system according to claim 18, wherein said readout order setting means sets the readout order of the data stored in said plurality of storage media in a unit of a storage medium.

23. The drive apparatus according to claim 18, wherein each of the data stored in said plurality of storage media is stored as one track, and said readout order setting means sets the readout order of the data stored in said plurality of storage media in a unit of a track.

24. The drive system according to claim 18, further comprising storage medium selection means for selecting a first storage medium and a second storage medium from among said plurality of storage media loaded in said loading means, wherein said control means controls said accessing means to access said first storage medium to read out data stored in said first storage medium and then access said second storage medium to write the data into said second storage medium.

25. The drive system according to claim 19, further comprising storage medium selection means for selecting a first storage medium and a second storage medium from among said plurality of storage media loaded in said loading means, and buffer means being accessed by said accessing means for temporarily storing data read out from any of said plurality of recording media, wherein said control means controls said selection means and accessing means so that said selection means first selects said first storage medium to allow accessing of said first storage medium by said accessing means and said accessing means accesses said first storage medium to read out data stored in said first storage medium and store the data into said buffer means, and then said selection means selects said second storage medium to allow accessing to said second storage medium and said accessing means accesses said second storage medium to write the data stored in said buffer means into said second storage medium.

26. The drive system according to claim 18, further comprising writing order setting means for setting a writing order of said plurality of storage media when data are stored into said plurality of storage media, wherein said control means controls said accessing means to successively access said storage media in accordance with the writing order set by said writing order setting means to continuously perform writing of the data into said plurality of storage media.

27. The drive system according to claim 19, further comprising writing order setting means for setting a writing order of said plurality of storage media when data are to be stored into said plurality of storage media, wherein said control means controls said selection means and said accessing means so that said selection means successively enables accessing to said storage media in accordance with the writing order set by said writing order setting means and said accessing means successively accesses said storage media, accessing to which is enabled by said selection means, to continuously perform writing of the data into said plurality of storage media.

28. The drive system according to claim 26, further comprising detection means for detecting a free capacity of each of said plurality of storage media into which data is written by said accessing means, wherein, when said detection means detects that each of said plurality of storage media which is accessed by said accessing means in accordance with the writing order set by said writing order setting means has no free capacity, said control means controls said accessing means to access one of said storage media which is to be accessed next in accordance with the writing order, thereby to continuously perform writing of the data.

29. The drive system according to claim 28, wherein, when said detection means detects that one of said plurality of storage media accessed last by said accessing means in accordance with the writing order set by said writing order setting means has no free capacity, then said control means controls said accessing means to end the writing into said plurality of storage media.

30. The drive system according to claim 26, wherein the data are data inputted from an external data source.

31. The drive system according to claim 30, wherein the data are broadcast data inputted from an external data source.

32. The drive system according to claim 26, wherein said writing order setting means sets a writing order of said plurality of storage media in accordance with an order set in advance.

33. The drive system according to claim 26, wherein said writing order setting means sets a writing order of said plurality of storage media in response to an instruction given by a user of said drive apparatus.

34. The drive system according to claim 18, wherein said plurality of storage media comprises a plurality of semiconductor memories.

35. A method of writing and/or reading out data into and from a storage medium including a memory element, comprising the steps of:
    loading a plurality of storage media having a plate shaped housing, so that data are individually written into and/or read out from the plurality of storage media;
    accessing the loaded plurality of storage media to write and/or read out the data into and from the plurality of storage media;
    performing, when said plurality of storage media are loaded, control to continuously perform writing into and/or reading out from said plurality of loaded storage media;
    setting a readout order of the data stored in the plurality of storage media; and
    accessing the data in accordance with the readout order to continuously perform reading out of the data.

36. A drive apparatus for writing and/or reading out data into and from a storage medium including a memory element, the apparatus comprising:
    loading means for loading a plurality of storage media having a plate-shaped housing, wherein data are individually written into and/or read out from each of the plurality of storage media;
    accessing means for accessing the plurality of storage media loaded in said loading means to write and/or read out the data into and from the plurality of storage media;
    control means for controlling, when said plurality of storage media are loaded in said loading means, said accessing means to continuously perform writing into and/or reading out from said plurality of storage media loaded in said loading means; and
    storage medium selection means for selecting a first storage medium and a second storage medium from among said plurality of storage media loaded in said loading means, wherein said control means controls said accessing means to access said first storage medium to read out data stored in said first storage medium and then to access said second storage medium to write the data into said second storage medium.

37. The drive apparatus according to claim 36, further comprising selection means for causing said accessing means to selectively access one of the plurality of storage media loaded in said loading means.

38. The drive apparatus according to claim 37, further comprising loading detection means for detecting whether a storage medium of said plurality of storage media is loaded in each of a plurality of storage medium loading portions of said loading means, wherein said selection means invalidates accessing by said accessing means to any of said storage medium loading portions in which said loading detection means detects that no storage medium is loaded.

39. The drive apparatus according to claim 37, further comprising loading detection means for detecting whether a storage medium of said plurality of storage media is loaded in each of a plurality of storage medium loading portions of said loading means, wherein said selection means allows accessing by said accessing means to any of said recording medium loading portions in which said loading detection means detects that any of said plurality of storage media is loaded.

40. The drive apparatus according to claim 36, further comprising readout order setting means for setting a readout order of the data stored in the plurality of storage media, wherein said control means controls said accessing means to successively access the data in accordance with the readout A order set by said readout order setting means to continuously perform reading out of the data.

41. The drive apparatus according to claim 40, wherein said readout order setting means sets the readout order of the data stored in said plurality of storage media in a unit of a storage medium.

42. The drive apparatus according to claim 40, wherein each of the data stored in said plurality of storage media is stored as one track, and said readout order setting means sets the readout order of the data stored in said plurality of storage media in a unit of a track.

43. The drive apparatus according to claim 37, further comprising storage medium selection means for selecting a first storage medium and a second storage medium from among said plurality of storage media loaded in said loading means, and buffer means being accessed by said accessing means for temporarily storing data read out from any of the plurality of recording media, wherein said control means controls said selection means and said accessing means so that said selection means first selects said first storage medium to allow accessing of the first storage medium by said accessing means and said accessing means accesses the first storage medium to read out data stored in the first storage medium and store the data into said buffer means, and then said selection means selects said second storage medium to allow accessing to the second storage medium and said accessing means accesses said second storage medium to write the data stored in said buffer means into the second storage medium.

44. The drive apparatus according to claim 36, further comprising writing order setting means for setting a writing order of said plurality of storage media when data are stored into the storage media, wherein said control means controls said accessing means to successively access the storage media in accordance with the writing order set by said writing order setting means to continuously perform writing of the data into said plurality of storage media in accordance with the writing order set by said writing order setting means.

45. The drive apparatus according to claim 37, further comprising writing order setting means for setting a writing order of said plurality of storage media when data are to be stored into the plurality of storage media, wherein said control means controls said selection means and said accessing means so that, in accordance with the writing order set by said writing order setting means, said selection means successively enables accessing to the storage media and said accessing means successively accesses the storage media, accessing to which is enabled by said selection means, to continuously perform writing of the data into said plurality of storage media.

46. The drive apparatus according to claim 44, further comprising detection means for detecting a free capacity of each of the plurality of storage media into which data is written by said accessing means, wherein, when said detection means detects that each of the plurality of storage media accessed by said accessing means in accordance with the writing order set by said writing order setting means has no free capacity, said control means controls said accessing means to access one of the storage media to be accessed next in accordance with the writing order, thereby to continuously perform writing of the data.

47. The drive apparatus according to claim 46, wherein, when said detection means detects that one of the plurality of storage media accessed last by said accessing means in accordance with the writing order set by said writing order setting means has no free capacity, then said control means controls said accessing means to end the writing into the plurality of storage media.

48. The drive apparatus according to claim 44, wherein the data are data inputted from an external data source.

49. The drive apparatus according to claim 48, wherein the data are broadcast data inputted from an external data source.

50. The drive apparatus according to claim 44, wherein said writing order setting means sets a writing order of said plurality of storage media in accordance with an order set in advance.

51. drive apparatus according to claim 44, wherein said writing order setting means sets a writing order of said plurality of storage media in response to an instruction given by a user of said drive apparatus.

52. The drive apparatus according to claim 36, wherein the plurality of storage media comprise a plurality of semiconductor memories.

53. A drive apparatus for writing and/or reading out data into and from a storage medium including a memory element, the apparatus comprising:
  loading means for loading a plurality of storage media having a plate-shaped housing, wherein data are individually written into and/or read out from each of the plurality of storage media;
  accessing means for accessing the plurality of storage media loaded in said loading means to write and/or read out the data into and from the plurality of storage media;
  control means for controlling, when said plurality of storage media are loaded in said loading means, said accessing means to continuously perform writing into and/or reading out from said plurality of storage media loaded in said loading means; and
  detection means for detecting a free capacity of each of the plurality of storage media into which data is written by said accessing means.

54. The drive apparatus according to claim 53, further comprising selection means for causing said accessing means to selectively access one of the plurality of storage media loaded in said loading means.

55. The drive apparatus according to claim 54, further comprising loading detection means for detecting whether a storage medium of said plurality of storage media is loaded in each of a plurality of storage medium loading portions of said loading means, wherein said selection means invalidates accessing by said accessing means to any of said storage medium loading portions in which said loading detection means detects that no storage medium is loaded.

56. The drive apparatus according to claim 54, further comprising loading detection means for detecting whether a storage medium of said plurality of storage media is loaded in each of a plurality of storage medium loading portions of said loading means, wherein said selection means allows accessing by said accessing means to any of said recording medium loading portions in which said loading detection means detects that any of said plurality of storage media is loaded.

57. The drive apparatus according to claim 53, further comprising readout order setting means for setting a readout order of the data stored in the plurality of storage media, wherein said control means controls said accessing means to successively access the data in accordance with the readout order set by said readout order setting means to continuously perform reading out of the data.

58. The drive apparatus according to claim 57, wherein said readout order setting means sets the readout order of the data stored in said plurality of storage media in a unit of a storage medium.

59. The drive apparatus according to claim 57, wherein each of the data stored in said plurality of storage media is stored as one track, and said readout order setting means sets the readout order of the data stored in said plurality of storage media in a unit of a track.

60. The drive apparatus according to claim 53, further comprising storage medium selection means for selecting a first storage medium and a second storage medium from among said plurality of storage media loaded in said loading means, wherein said control means controls said accessing means to access said first storage medium to read out data stored in said first storage medium and then to access said second storage medium to write the data into said second storage medium.

61. The drive apparatus according to claim 54, further comprising storage medium selection means for selecting a first storage medium and a second storage medium from among said plurality of storage media loaded in said loading means, and buffer means being accessed by said accessing means for temporarily storing data read out from any of the plurality of recording media, wherein said control means controls said selection means and said accessing means so that said selection means first selects said first storage medium to allow accessing of the first storage medium by said accessing means and said accessing means accesses the first storage medium to read out data stored in the first storage medium and store the data into said buffer means, and then said selection means selects said second storage medium to allow accessing to the second storage medium and said accessing means accesses said second storage medium to write the data stored in said buffer means into the second storage medium.

62. The drive apparatus according to claim 53, further comprising writing order setting means for setting a writing order of said plurality of storage media when data are stored into the storage media, wherein said control means controls said accessing means to successively access the storage media in accordance with the writing order set by said writing order setting means to continuously perform writing of the data into said plurality of storage media in accordance with the writing order set by said writing order setting means.

63. The drive apparatus according to claim 54, further comprising writing order setting means for setting a writing order of said plurality of storage media when data are to be stored into the plurality of storage media, wherein said control means controls said selection means and said accessing means so that, in accordance with the writing order set by said writing order setting means, said selection means successively enables accessing to the storage media and said accessing means successively accesses the storage media, accessing to which is enabled by said selection means, to continuously perform writing of the data into said plurality of storage media.

64. The drive apparatus according to claim 53, wherein, when said detection means detects that one of the plurality of storage media accessed last by said accessing means in accordance with the writing order set by said writing order setting means has no free capacity, then said control means controls said accessing means to end the writing into the plurality of storage media.

65. The drive apparatus according to claim 62, wherein the data are data inputted from an external data source.

66. The drive apparatus according to claim 65, wherein the data are broadcast data inputted from an external data source.

67. The drive apparatus according to claim 62, wherein said writing order setting means sets a writing order of said plurality of storage media in accordance with an order set in advance.

68. The drive apparatus according to claim 62, wherein said writing order setting means sets a writing order of said plurality of storage media in response to an instruction given by a user of said drive apparatus.

69. The drive apparatus according to claim 53, wherein the plurality of storage media comprise a plurality of semiconductor memories.

* * * * *